(12) United States Patent
Umapathi

(10) Patent No.: US 11,123,729 B2
(45) Date of Patent: Sep. 21, 2021

(54) DIRECTING MOTION OF DROPLETS USING DIFFERENTIAL WETTING

(71) Applicant: Volta Labs, Inc., Cambridge, MA (US)

(72) Inventor: Udayan Umapathi, Cambridge, MA (US)

(73) Assignee: VOLTA LABS, INC., Cambridge, MA (US)

(*) Notice: Subject to any disclaimer, the term of this patent is extended or adjusted under 35 U.S.C. 154(b) by 0 days.

(21) Appl. No.: 16/711,352

(22) Filed: Dec. 11, 2019

(65) Prior Publication Data

US 2020/0114360 A1    Apr. 16, 2020

Related U.S. Application Data

(63) Continuation of application No. PCT/US2019/019954, filed on Feb. 28, 2019.
(Continued)

(51) Int. Cl.
*B01L 3/00* (2006.01)
*B01L 3/02* (2006.01)
(Continued)

(52) U.S. Cl.
CPC .... *B01L 3/502715* (2013.01); *B01F 13/0071* (2013.01); *B01F 13/0076* (2013.01);
(Continued)

(58) Field of Classification Search
CPC ....... B01L 3/502792; B01L 2400/0424; B01L 3/00; B01L 3/02; B01F 13/0071;
(Continued)

(56) References Cited

U.S. PATENT DOCUMENTS 6,565,727 B1    5/2003   Shenderov
6,911,132 B2    6/2005   Pamula et al.
(Continued)

FOREIGN PATENT DOCUMENTS

CN    104307582 A    1/2015
KR    101358831 B1   2/2014
(Continued)

OTHER PUBLICATIONS

Byun, et al. Wireless EWOD (electrowetting on dielectric) device using planar coils. 16th International Conference on Miniaturized systems for chemistry and Life Sciences. Oct. 28-Nov. 1, 2012, Okinawa, Japan. pp. 344-346.
(Continued)

*Primary Examiner* — Brian J. Sines
(74) *Attorney, Agent, or Firm* — Wilson Sonsini Goodrich & Rosati

(57) ABSTRACT

Apparatus for controlling motion of liquid droplets. A set of electrode pads is arranged to define one or more tracks over which liquid droplets may be induced to move over a sequence of 5 the electrode pads. A surface over the electrode pads is dielectric, smooth, and slippery to the droplets. In some cases, the smooth surface is formed as a thin layer of a second liquid that is immiscible with the liquid of the droplets. The surface has wetting affinity to the liquid that can be individually varied in a controlled manner by application of voltage to respective electrode pads. A control is designed to alter the wetting characteristic of varying-wettability portions of 10 the surface over respective electrode pads to effect induced motion of the droplets over the surface. The apparatus is designed with the smooth hydrophobic surface open, with no overlying or facing electrode or plate above the droplets.

30 Claims, 20 Drawing Sheets

Related U.S. Application Data

(60) Provisional application No. 62/811,018, filed on Feb. 27, 2019, provisional application No. 62/636,268, filed on Feb. 28, 2018.

(51) Int. Cl.
| | |
|---|---|
| *G01N 1/10* | (2006.01) |
| *G01N 35/00* | (2006.01) |
| *H05K 3/28* | (2006.01) |
| *G02B 26/00* | (2006.01) |
| *B01F 13/00* | (2006.01) |

(52) U.S. Cl.
CPC ......... *B01L 3/5085* (2013.01); *B01L 3/50273* (2013.01); *B01L 3/502792* (2013.01); *G02B 26/005* (2013.01); *H05K 3/28* (2013.01); *B01F 2215/0037* (2013.01); *B01L 2300/0645* (2013.01); *B01L 2300/0816* (2013.01); *B01L 2300/0887* (2013.01); *B01L 2300/12* (2013.01); *B01L 2300/161* (2013.01); *B01L 2400/02* (2013.01); *B01L 2400/0427* (2013.01); *H05K 2203/0759* (2013.01)

(58) Field of Classification Search
CPC ....... B01F 13/0076; B01F 13/00; G01N 1/10; G01N 35/00
See application file for complete search history.

(56) References Cited

U.S. PATENT DOCUMENTS

| | | | |
|---|---|---|---|
| 7,727,723 B2 | 6/2010 | Pollack et al. | |
| 7,901,947 B2 | 3/2011 | Pollack et al. | |
| 7,939,021 B2 | 5/2011 | Smith et al. | |
| 8,137,917 B2 | 3/2012 | Pollack et al. | |
| 8,147,668 B2 | 4/2012 | Pollack et al. | |
| 8,268,246 B2 | 9/2012 | Srinivasan et al. | |
| 8,329,407 B2 | 12/2012 | Ismagilov et al. | |
| 8,388,909 B2 | 3/2013 | Pollack et al. | |
| 8,409,417 B2 | 4/2013 | Wu | |
| 8,481,125 B2 | 7/2013 | Yi et al. | |
| 8,822,148 B2 | 9/2014 | Ismagilov et al. | |
| 8,936,708 B2 | 1/2015 | Feiglin et al. | |
| 9,039,973 B2 | 5/2015 | Watson et al. | |
| 9,139,865 B2 | 9/2015 | Pollack et al. | |
| 9,216,415 B2 | 12/2015 | Shenderov et al. | |
| 9,243,282 B2 | 1/2016 | Pollack et al. | |
| 9,249,443 B2 | 2/2016 | Wheeler et al. | |
| 9,358,551 B2 | 6/2016 | Thwar et al. | |
| 9,496,125 B2 | 11/2016 | Bunner et al. | |
| 9,545,641 B2 | 1/2017 | Winger | |
| 2003/0047688 A1* | 3/2003 | Faris | B01L 3/502792 |
| | | | 250/432 R |
| 2004/0058450 A1* | 3/2004 | Pamula | B01F 13/0071 |
| | | | 436/150 |
| 2004/0211659 A1* | 10/2004 | Velev | B01F 13/0071 |
| | | | 204/164 |
| 2006/0146099 A1* | 7/2006 | Wang | B41J 2/005 |
| | | | 347/75 |
| 2007/0023292 A1 | 2/2007 | Kim et al. | |
| 2008/0169197 A1* | 7/2008 | McRuer | B01F 13/0086 |
| | | | 204/600 |
| 2010/0112286 A1* | 5/2010 | Bahadur | B01L 3/502746 |
| | | | 428/141 |
| 2013/0270114 A1 | 10/2013 | Feiglin | |
| 2014/0161686 A1* | 6/2014 | Bort | B01L 3/502715 |
| | | | 422/502 |
| 2015/0038344 A1 | 2/2015 | Pollack et al. | |
| 2015/0075985 A1 | 3/2015 | Pollack et al. | |
| 2016/0299101 A1 | 10/2016 | Pantoja et al. | |
| 2017/0074603 A1* | 3/2017 | Bahadur | F28D 15/025 |
| 2018/0164577 A1* | 6/2018 | Dryfe | G02B 26/004 |
| 2018/0318826 A1* | 11/2018 | Umapathi | B33Y 10/00 |
| 2019/0262829 A1 | 8/2019 | Umapathi | |
| 2019/0329259 A1* | 10/2019 | Wu | B01L 3/502792 |

FOREIGN PATENT DOCUMENTS

| | | |
|---|---|---|
| KR | 101686657 B1 | 12/2016 |
| WO | WO-2016164592 A1 | 10/2016 |
| WO | WO-2019169076 A1 | 9/2019 |

OTHER PUBLICATIONS

Dey, et al. Electrically Modulated Wetting of Drops on Soft Dielectric Films. Microfluidics and Nanofluidics. 2017, 21:48 (28 pages).

Gong, et al. Direct-referencing Two-dimensional-array Digital Microfluidics Using Multi-layer Printed Circuit Board. J Microelectromech Syst. 2008; 17(2): 257-264.

Groszek, et al. Measurements of hydrophobic and hydrophilic surface sites by flow microcalorimetry. Langmuir. 1993; 9/10: 2721-2725.

Lee, et al. Implementing Liquid Manipulations By Electrowetting and Dielectrophoresis With Pcb and Dielectric Sheets. National Taiwan University. Conference Paper. Jul. 2015. Conference: The 5th International Conference on Optofluidics 2015.

Li, et al. A fast fabricating electro-wetting platform to implement large droplet manipulation. 2014 IEEE 57th International Midwest Symposium on Circuits and Systems (MWSCAS). pp. 326-329.

Paik, et al. Coplanar digital microfluidics using standard printed circuit board processes. 9th International conference on Miniaturized systems for chemistry and Life Sciences. Oct. 9-13, 2005. Boston, Massachusetts, USA. pp. 566-568.

PCT/US2019/019954 International Search Report and Written Opinion dated Jun. 14, 2019.

Wikipedia: Electrowetting. Available at https://en.wikipedia.org/w/index.php?title=Eletrowetting&oldid=825471189. Accessed on Feb. 18, 2019.

Zhao, et al. Fundamentals and Applications of Electrowetting. Reviews of Adhesion and Adhesives, No. 1 / Feb. 2013, pp. 114-174.

* cited by examiner

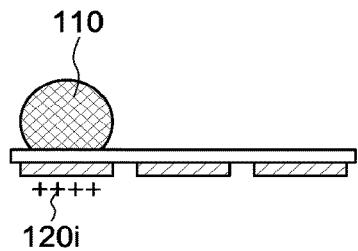
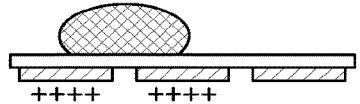
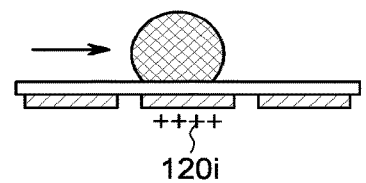
FIG. 10A  FIG. 10B  FIG. 10C
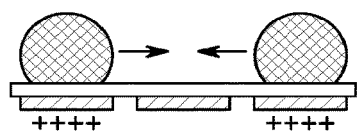
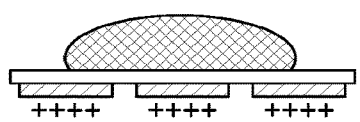
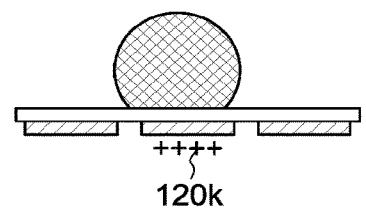
FIG. 10D  FIG. 10E  FIG. 10F
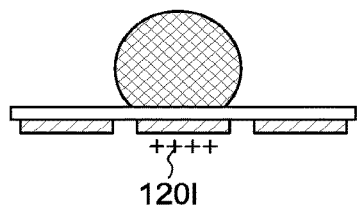
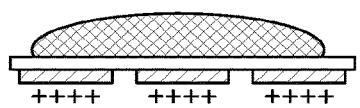
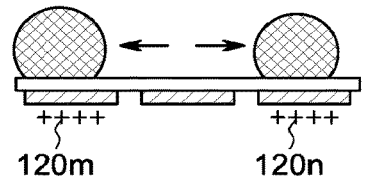
FIG. 10G  FIG. 10H  FIG. 10I

DIRECTING MOTION OF DROPLETS USING DIFFERENTIAL WETTING

CROSS-REFERENCE

This application is a Continuation of International Patent Application Serial No. PCT/US2019/019954, filed on Feb. 28, 2019, which claims the benefit of priority from U.S. Provisional Application No. 62/811,018, filed on Feb. 27, 2019, and further claims the benefit of priority from U.S. Provisional Application No. 62/636,268, filed on Feb. 28, 2018, the entire disclosures of which are hereby incorporated by reference in their entirety for all purposes.

This application relates to controlling and manipulating a liquid or gas in a device that is small, 10 typically milliliter to sub-microliter scale.

SUMMARY OF THE INVENTION

In general, in a first aspect, the invention features apparatus for controlling motion of liquid droplets. A set of electrode pads is arranged in an array or in paths defining one or more tracks over which liquid droplets may be induced to move over a sequence of the electrode pads. A surface over the electrode pads is dielectric, smooth to within 2 µm, has a slide angle for a 5 µl droplet of the liquid of no more than 5 degrees, and has a wetting affinity to the liquid that can be altered by application of voltage to the electrode pads. A control is designed to alter the wetting characteristic of portions of the surface over respective electrode pads to effect induced motion of the droplets over the tracks, the wetting characteristic to be altered by controlling charging and discharging of the electrode pads in a desired sequence.

In general, in a second aspect, the invention features apparatus for controlling motion of liquid droplets. A smooth, hydrophobic surface has portions with a wetting affinity to the liquid that can be varied in a controlled manner. The varying-wettability portions are arranged in an array or in paths defining one or more tracks over which liquid droplets may be induced to move over a sequence of the varying-wettability portions. A control is designed to vary the wetting characteristic of varying-wettability portions of the surface to effect induced motion of the droplets over the tracks. The apparatus is designed with the smooth hydrophobic surface open, with no overlying or facing electrode or plate above the droplets.

In general, in a third aspect, the invention features apparatus for controlling motion of liquid droplets. A solid surface is textured to hold a thin layer of a second liquid that is immiscible with the liquid of the droplets, an upper surface of the second liquid forming a liquid-liquid surface that is slippery with respect to the liquid droplets, having a slide angle for a 5 µl droplet of the droplet liquid of no more than 5 degrees, and having a wetting affinity to the droplet liquid that can be varied under control, the varying-wettability portions being arranged in an array or in paths defining one or more tracks over which the liquid droplets may be induced to move over a sequence of the varying-wettability portions. A control is designed to vary the wetting characteristic of varying-wettability portions of the liquid-liquid surface to effect induced motion of the droplets over the tracks.

In general, in a fourth aspect, the invention features apparatus for controlling motion of liquid droplets. A set of electrode pads is arranged in an array or in paths defining one or more tracks over which liquid droplets may be induced to move over a sequence of the electrode pads. A surface over the electrode pads is dielectric, smooth to within the smooth surface being formed as a thin layer of a second liquid that is immiscible with the liquid of the droplets, an upper surface of the second liquid forming a liquid-liquid surface that is hydrophobic, having a slide angle for a 5 µl droplet of the liquid of no more than 5 degrees, and having portions whose wetting affinity to the liquid that can be individually varied in a controlled manner by application of voltage to respective electrode pads, the varying-wettability portions being arranged in an array or in paths defining one or more tracks over which liquid droplets may be induced to move over a sequence of the varying-wettability portions. The second liquid is laid as a thin layer on a surface of an underlying solid substrate that is textured to hold the second liquid stable against gravity. A control is designed to alter the wetting characteristic of varying-wettability portions of the surface over respective electrode pads to effect induced motion of the droplets over the tracks, the wetting characteristic to be altered by controlling charging and discharging of the electrode pads in a desired sequence. The apparatus is designed with the smooth hydrophobic surface open, with no overlying or facing electrode or plate above the droplets.

In general, in a fifth aspect, the invention features a method. A liquid droplet is introduced onto a surface over a set of electrode pads arranged in an array or in paths defining one or more tracks over which the liquid droplet may be induced to move over a sequence of the electrode pads. The surface is dielectric, hydrophobic, smooth to within 2 µtm, and has a slide angle for a 5 µl droplet of the liquid of no more than 5 degrees, and has a wetting affinity to the liquid that can be altered by application of voltage to the electrode pads. The varying-wettability portions are arranged in an array or in paths defining one or more tracks over which liquid droplets may be induced to move over a sequence of the varying-wettability portions. The wetting characteristic of portions of the surface over respective electrode pads is controlled to effect induced motion of the droplet over the tracks, the wetting characteristic to be altered by controlling charging and discharging of the electrode pads in a desired sequence. The surface is designed with the smooth hydrophobic surface open, with no overlying or facing electrode or plate above the droplets.

Embodiments of the invention may include one or more of the following features. The motive voltage may be less than 100V, less than 80V, less than 50V, less than 40V, less than 30V, or less than 20V. The electrodes may be printed on a substrate using printed circuit board technology, or manufactured using thin-film transistor (TFT), active matrix, or passive matrix backplane technology. Various levels of smoothing may be preferred, from 5 µm, 2 µtm, 1 µm, 500 nm, 200 nm, or 100 nm. The surface may be smoothed to within 1 µm by polishing. The surface may be smoothed to within 1 µm by applying a coating, the coating applied by at least one of spin coating, spray coating, dip coating, or vapor deposition. The surface coating may be of a material that is both dielectric and hydrophobic. The surface may be smoothed to within 1 µm by application of a sheet of a polymer stretched to remove wrinkles. The slide angle may be imparted to the surface by patterning or texturing to induce hydrophobicity. The slide angle of a 5 µl droplet may be no more than 5°, 3°, 2°, or 1°. A set of electrode pads may be arranged in an array or in paths defining one or more tracks over which liquid droplets may be induced to move over a sequence of the electrode pads, the varying-wettability portions being a dielectric surface over the electrode pads. The wettability of the varying-wettability portions of the surface may be varied via application of light. The varying-wettability portions of the surface may operate by optoelectrowetting. The varying-wettability portions of the surface may operate by photoelectrowetting. The smooth surface may have one or more holes, for example, to introduce liquid droplets or reactants, or to allow passage of light. The apparatus may include stations for one or more of, or two or more of, or three or more of, or four or more of, the group consisting of dispensing, mixing, heating, cooling, application of magnetic field, application of electric field, addition of reagent, optical inspection or assay, and isolation or purification of proteins, peptides, or any other biopolymer. An acoustic transducer may be configured to introduce to introduce liquid droplets into the apparatus. A microdiaphragm pump may be configured to introduce to introduce liquid droplets into the apparatus. Other alternatives for introducing or injecting liquid droplets may include inkjet printer inkjet nozzles, syringe pumps, capillary tubes, or pipettes. The second liquid may be an oil that has wetting affinity for the solid, and is held to a textured surface of the solid.

The above advantages and features are of representative embodiments only, and are presented only to assist in understanding the invention. It should be understood that they are not to be considered limitations on the invention as defined by the claims. Additional features and advantages of embodiments of the invention will become apparent in the following description, from the drawings, and from the claims.

DESCRIPTION OF THE DRAWINGS

FIGS. 1(*b*), 2(*a*), 2(*b*), 3(*a*), 3(*b*), 3(*c*), 4(*a*), 4(*b*), 4(*c*), 5(*a*), 5(*b*), 6(*a*), 6(*b*), 6(*c*), 10(*a*), 10(*b*), 10(*c*), 10(*d*), 10(*e*), 10(*f*), 10(*g*), 10(*h*), 10(*i*) are side sectional views of droplets on an electrowetting surface.

FIGS. 11(*b*), 11(*c*), 11(*d*), and 11(*e*) are top plan views of processing stations of an electrowetting device.

FIGS. 11(*f*) and 11(*h*) are perspective views of processing stations for an electrowetting device.

FIGS. 11(*g*), 11(*i*), and 11(*j*) are side section views of processing stations for an electrowetting device.

FIGS. 12(*b*) and 12(*c*) are side section views of microfluidic devices.

DESCRIPTION

Figure 1A:
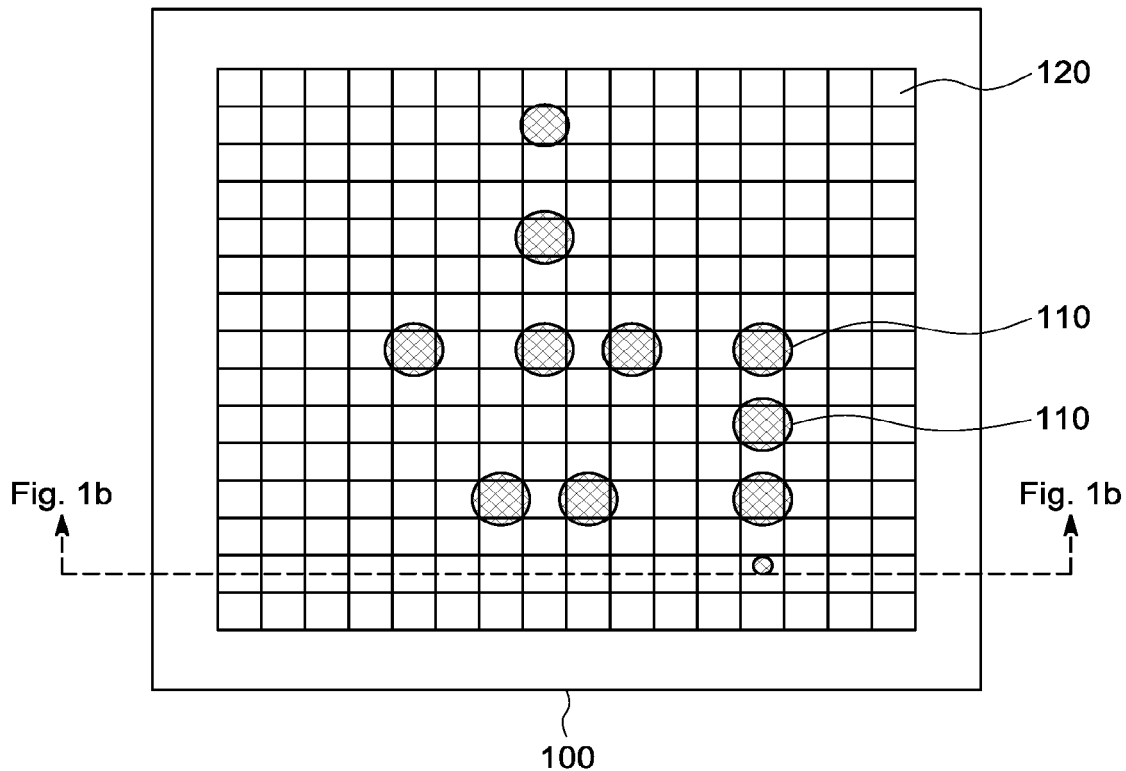
FIG. 1(*a*) is a plan view of droplets on an electrowetting surface.
Figure 1B:
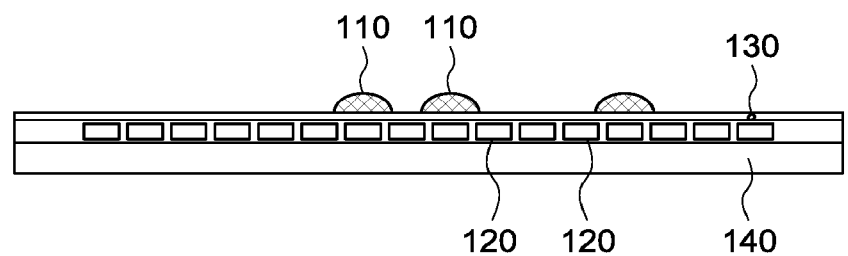

The Description is organized as follows.
I. Introduction
   I.A. Liquid-on-liquid electrowetting (LLEW) for electrowetting
   I.B. Electrowetting on a dielectric (EWOD) for droplet manipulation II. Manufacturing methods for electrowetting arrays
   II.A. Substrates for Electrowetting
   II.B. Creating smooth dielectric surface on the electrode array
     II.B.1. Smoothing with photoresist/epoxy/potting compound
       (a) Creating a dielectric on the smooth photoresist/epoxy/potting compound
         (i) Deposit thin film coatings as dielectric
         (ii) Bond polymer films to form top-most dielectric
     II.B.2. Using excess photoresist and polishing to a smooth dielectric surface
     II.B.3. Polymer film as a smooth dielectric surface
   II.C. Creating a final slippery surface finish
     II.C.1. Modifying solid dielectric to achieve hydrophobicity
       (a) Surface chemistry modification (functionalization)
       (b) Surface topography modification
         (i) Creating micropillars
         (ii) Microspheres
   II.D. Slippery liquid coating and liquid-on-liquid electrowetting (LLEW)
     II.D.1. Droplets on thin film liquid layer in LLEW
     II.D.2. Creating textured solid for LLEW
     II.D.3. Applying lubricating oil onto the textured solid
III. Unique Properties of liquid-on-liquid electrowetting (LLEW)
   III.A. Low actuation voltage
   III.B. Cleaning by washing an LLEW device surface
IV. Applications of electrowetting
   IV.A. Arbitrarily-large open face
   IV.B. Droplet motion, merging and splitting
   IV.C. Lab in a box (desktop digital wetlab)
   IV.D. Process stations
     IV.D.1. Mixing stations
     IV.D.2. Incubation station
     IV.D.3. Magnetic bead station
     IV.D.4. Nucleic acid delivery station
     IV.D.5. Optical inspection station
     IV.D.6. Loading/unloading via acoustic liquid handlers or microdiaphragm based pump dispenser
V. Alternative implementations
   V.A. Droplet on open surface (single plate configuration) or sandwiched between two plates (two plate configuration)
   V.B. Optoelectrowetting and photoelectrowetting
   V.C. Principle of Optoelectrowetting
   V.D. Photoelectrowetting
   V.E. Two-plate electrowetting systems
   V.F. Software and hardware
   V.G. Other alternatives I. Introduction Referring to FIG. 1, an electrowetting device may be used to move individual droplets of water (or other aqueous, polar, or conducting solution) from place to place. The surface tension and wetting properties of water may be altered by electric field strength using the electrowetting effect. The electrowetting effect arises from the change in solid-electrolyte contact angle due to an applied potential difference between the solid and the electrolyte. Differences in wetting surface tension that vary over the width of the droplet, and corresponding change in contact angle, may provide motive force to cause the droplets to move, without moving parts or physical contact. Electrowetting device 100 may include a grid of electrodes 120 with a dielectric layer 130 with appropriate electrical and surface priorities overlaying electrodes 120, all laid on a rigid insulating substrate 140.

It may be desirable to prepare the surface 130 of the electrode grid so that it has low adhesion with water. This allows water droplets 110 to be moved along the surface by small forces generated by gradients in electric field and surface tension across the width of the droplet. A surface with low adhesion may reduce the trail left behind from a droplet. A smaller trail may reduce droplet cross contamination, and may reduce sample loss during droplet movement. Low adhesion to surface may also allow for low actuation voltage for droplet motion and repeatable behavior of droplet motion. There are several ways to measure low adhesion between a surface and a droplet:

Slide angle: as a surface is tipped up from horizontal level, at what angle does a droplet of a given size begin to move under the force of gravity? For example, a surface that holds a 5 µl droplet at 4° but allows it to slide at 5° may be said to have a 50 slide angle of 5°. For various applications, 5 µl slide angles of 10°, 5°, 3°, 2°, and 1° may be desirable. The smaller the slide angle, the more slippery the surface may be said to be, and generally the lower the voltage required to move droplets across the surface.

Contact angle hysteresis: in a surface with low surface adhesion, as a liquid droplet moves across the surface, the contact angle between the leading edge and the surface vs. the trailing edge and the surface will be close the same, determined largely by the liquid's surface tension. As the droplet moves across a surface with higher adhesion, the leading and trailing contract angles will separate. High liquid-surface hydrophobicity and low surface energy will result in less difference in angle. Contact angle hysteresis (that is, the difference between leading and trailing contact angles) of 15°, 10°, 7°, 5°, 3°, and 2° may be progressively more desirable.

There are several ways to achieve low surface adhesion; for example, mechanically polishing until smooth within a few nanometers, applying coating to fill surface irregularities, chemically modifying the surface to create desirable surface properties (hydrophobic, hydrophilic, varying with electric field strength, etc.)

I.A. Liquid-On-Liquid Electrowetting (LLEW) for Electrowetting

Figure 2A:
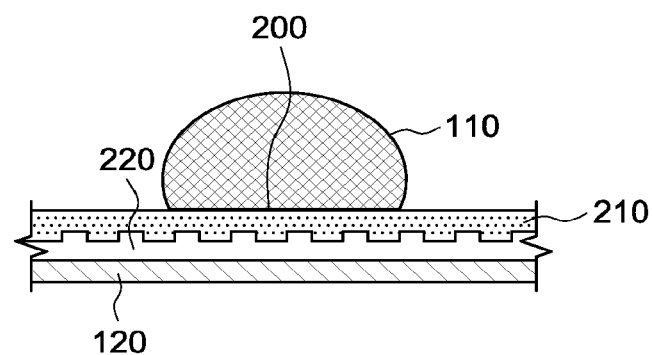
Figure 2B:
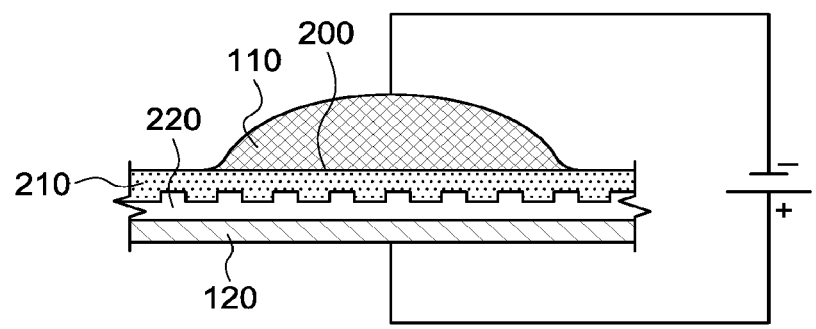

Referring to FIGS. 2(a) and 2(b), an electrowetting mechanism called "liquid-on-liquid-electrowetting" (LLEW) takes advantage of an electrowetting phenomenon that occurs at a liquid-liquid-gas interface 200. A water droplet 110 riding on the surface of a layer of a low-surface energy liquid 210 (such as oil) and substantially surrounded by air (vapor or gas) creates a liquid-liquid-gas interface at the contact line 200. The oil 210 may be stabilized in place on the solid substrate by a textured surface 220 of the solid substrate, and the conductive layer of metal electrodes 120 may be embedded in the body of this solid. Referring to FIG. 2(b), when an electric potential is applied across the height of droplet 110, the liquid-liquid-gas interface 200 causes droplet 110 to wet the oil 210 and spread across the surface while still riding on the oil 210.

Figure 3A:
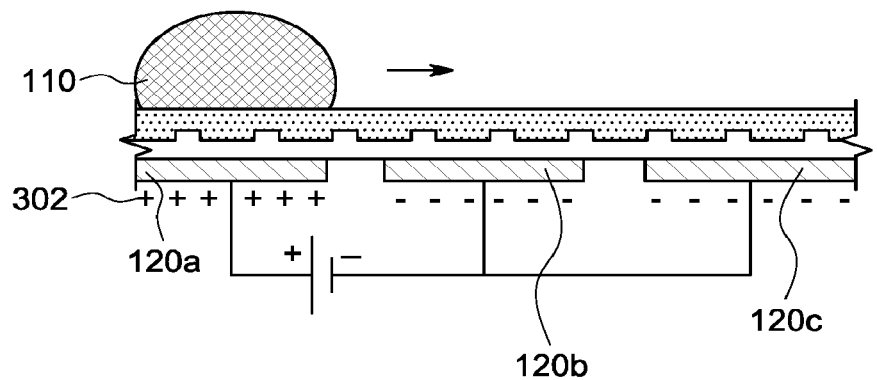
Figure 3B:
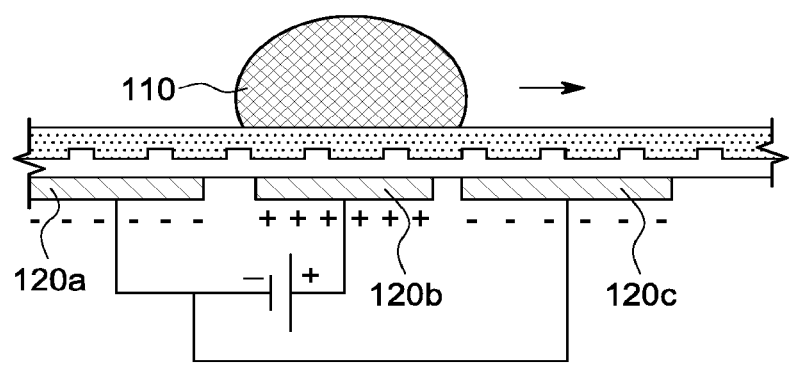
Figure 3C:
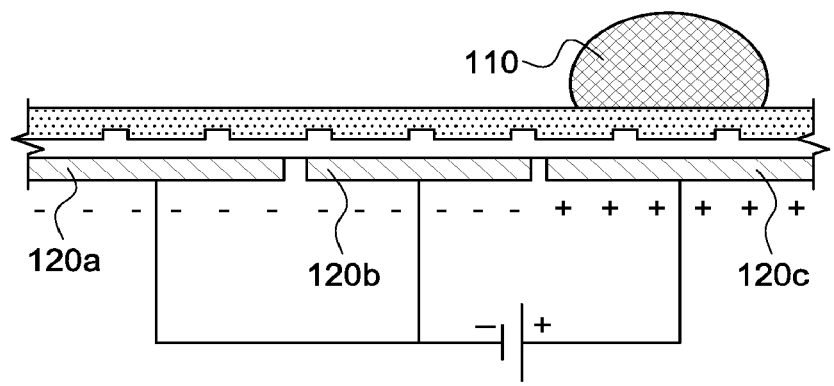

Referring to FIGS. 3(a), 3(b), and 3(c), the liquid-on-liquid electrowetting technique may be used to manipulate droplets 110 that contain biological and chemical samples. In FIG. 3(a), droplet 110 is in motion from left to right, and has just been attracted onto the leftmost of three electrodes 120a by a positive voltage 302 on that leftmost electrode 120a, with consequent addition of electric field at the liquid-liquid surface and enhanced wetting. In FIG. 3(b), the voltage is withdrawn from the leftmost electrode 120a and applied to the center electrode 120b. Because of the enhanced wetting over the center electrode 120b, the droplet has been attracted to the center position in FIG. 3(b). In FIG. 3(c), the voltage is withdrawn from the left and center electrodes 120a, 120b and applied to the right electrode 120c, and the enhanced wetting over the right electrode 120c has attracted the droplet to the right.

Figure 4A:
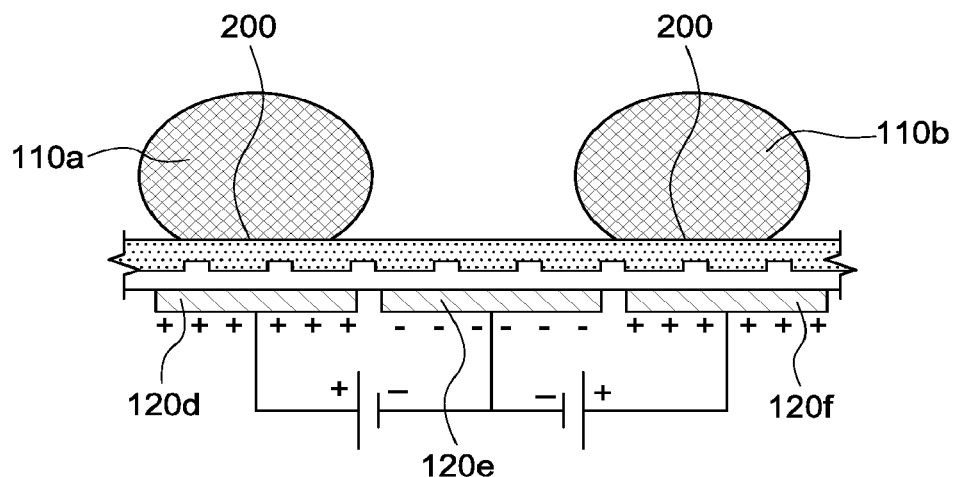
Figure 4B:
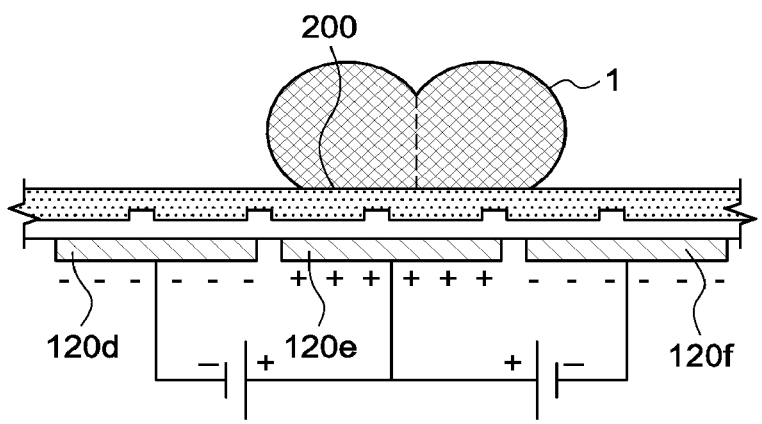
Figure 4C:
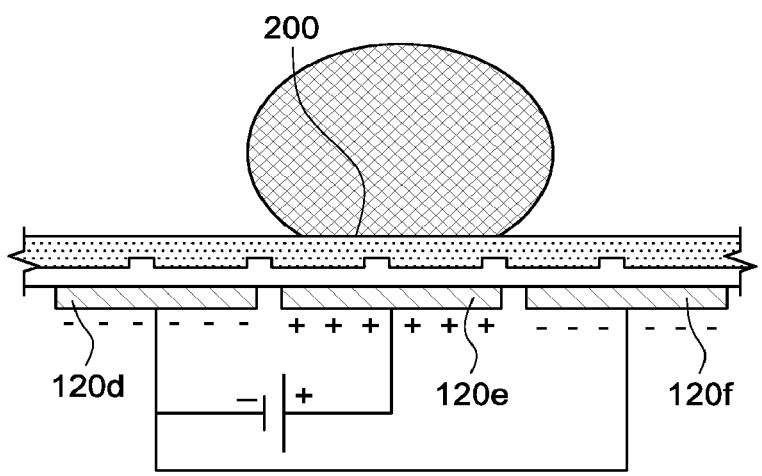

Referring to FIGS. 4(a), 4(b), and 4(c), differential wetting may be used to merge two droplets 110a, 110b on a LLEW surface 200 over an electrode array 120d, 120e, 120f. In FIG. 4(a), two droplets have been attracted to the leftmost and rightmost electrodes 120d, 120f. In FIG. 4(b), the voltage is removed from the left and right electrodes 120d, 120f and applied to the center electrode 120e. The two droplets are attracted from left and right to center 120e and begin to merge. In FIG. 4(c), merger of the two droplets is complete.

Referring to FIGS. 3(a), 3(b), 3(c), 4(a), 4(b), and 4(c), such a microfluidic selective wetting device may be capable of performing microfluidic droplet actuation such as droplet transport, droplet merging, droplet mixing, droplet splitting, droplet dispensing, droplet shape change. This LLEW droplet actuation may then be used for a microfluidic device to automate biological experiments such as liquid assays, in devices for medical diagnostics and in many lab-on-a-chip applications.

I.B. Electrowetting on a Dielectric (EWOD) for Droplet Manipulation

Figure 5A:
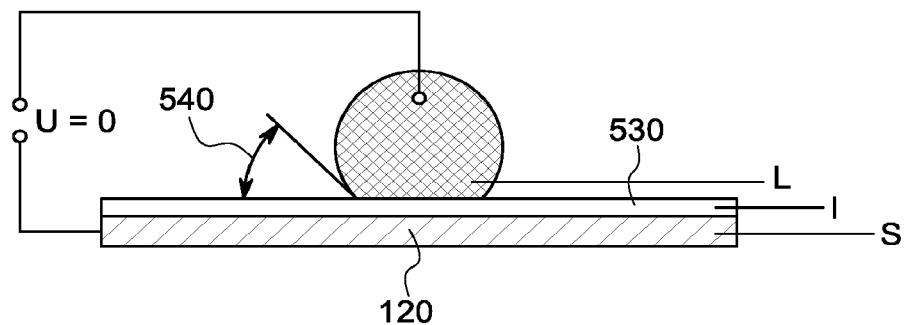
Figure 5B:
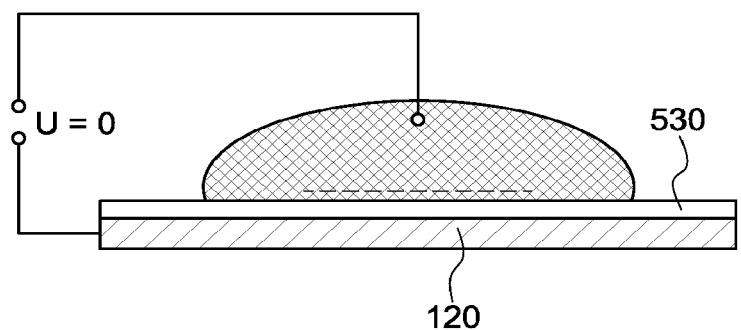

Referring to FIGS. 5(a) and 5(b), Electrowetting on Dielectric (EWOD) is a phenomenon in which the wettability of an aqueous, polar, or conducting liquid may be modulated through an electric field across a dielectric film 530 between the droplet and conducting electrode 120. Adding or subtracting charge from electrode 120 may change the wettability of an insulating dielectric layer 530, and that wettability change is reflected in a change to contact angle 540 of the droplet 110. The contact angle change may in turn cause the droplet 110 to change shape, to move, to split into smaller droplets, or to merge with another droplet. As represented by Equation 2, the contact angle 540 is a function of the applied voltage.

The wetting behavior (wetting or wettability) of a liquid on a solid surface refers to how well a liquid spreads on the solid surface. The wettability of a droplet on a solid surface surrounded by air is governed by interfacial tension between the solid, liquid, and gas medium. For an immobile droplet, the wettability is measured in terms of the contact angle 540 with the solid surface, which is governed by Young's equation:

$$YSL = YSG + YLG \cos(\theta e) \qquad \text{(Equation 1)}$$

where $s_L$ is the solid-liquid surface tension, $y_{LG}$ is the liquid air surface tension, $y_{SG}$ the solid-gas surface tension ee is the contact angle under equilibrium.

Gabriel Lippman observed that the capillary level of mercury in an electrolyte changes when a voltage is applied. This phenomenon (electro-capillarity) is then described through Lippmann-Young's equation:

$$\cos(\theta_u) = \cos(\theta_0) + 1/LG * \frac{1}{2} * C * U^2 \qquad \text{(Equation 2)}$$

$\theta_0$ is the contact angle when the electric field is zero (i.e. no voltage applied) and 0, is the contact angle when a voltage U is applied, and c is the capacitance per unit area between the electrode and the droplet.

II. Manufacturing Methods for Electrowetting Arrays

An electrowetting device to be used for transporting and mixing liquids of biological liquids may consist of an array of electrodes 120 on an insulating substrate, a thin layer of dielectric 130 and, if necessary, a final slippery coating. Sometimes the dielectric layer itself may provide sufficient hydrophobic and slippery behavior with or without additional chemical or topographical modification.

The electrode grid 120 on an insulating substrate may be fabricated using some combination of one or more of the following methods—printed circuit board manufacturing, CMOS, or HV CMOS or other semiconductor fabrication methods, manufactured using thin-film transistor (TFT), active matrix, or passive matrix backplane technology, or any other method that is capable of laying conductive circuits on an insulating substrate. To isolate the biological liquid during motion and mixing, the surface of the electrode array may be covered with a dielectric with one of the many methods described below.

The PCB and surface electrodes may be fabricated using thin-film-transistor (TFT), active matrix or passive matrix backplane technology.

The chemistry and texture of the top surface of the dielectric interacting with a droplet govern the voltages required for successful and repeated motion of droplets. As a result of the chemical makeup and physical texture, a droplet on an electrowetting device may experience two phenomena when in motion: droplet pinning and contact angle hysteresis. Droplet pinning phenomenon is when a droplet gets stuck to any local surface defects when it is being moved. Contact angle hysteresis is the difference in the advancing and the receding contact angle for a droplet in motion. As a result of droplet pinning and high contact angle hysteresis, droplets on an electrowetting surface may require significantly high voltage. The chemical makeup of the surface, the texture and slipperiness of the surface, and smoothness of the surface also may result in droplets leaving a trail behind as it is being moved. This trail may be as simple as just one molecule.

To reduce pinning, contact angle hysteresis and trail left behind by a droplet, typically the dielectric covering the electrode array is smoothed and then chemically modified to create a surface with low surface energy. Surface energy is the energy associated with the intermolecular forces at the interface between two media. A droplet interacting with a low surface energy surface is repelled by the surface and considered hydrophobic. Sometimes the dielectric layer itself provides a sufficiently slippery surface for droplet motion.

The following section describes various materials used in manufacturing an electrowetting device: substrate for laying conductive material, conductive materials for electrodes and interconnects, dielectric material, methods for depositing dielectric materials, achieving smooth surface on the dielectric and hydrophobic coating materials to provide slippery surface for droplet motion.

II.A. Substrates for Electrowetting

An electrowetting microfluidic device may be formed by creating a slippery (in the sense of low surface energy) surface directly on the electrode array 120. Electrode arrays consist of conductive plates 120 that charge electrically to actuate the droplets. Electrodes in an array may be arranged in an arbitrary layout, for example a rectangular grid, or a collection of discrete paths. The electrodes themselves may be made of any combination of conductive metal (for example, gold, silver, copper, nickel, aluminum, platinum, titanium), conductive oxides (indium tin oxide, aluminum doped zinc oxide) and semiconductors (for example, silicon dioxide). The substrates for laying out the electrode array may be any insulating materials of any thickness and rigidity.

The electrode arrays may be fabricated on standard rigid and flexible printed circuit board substrates. The substrate for the PCB may be FR4 (glass-epoxy), FR2 (glass-epoxy) or insulated metal substrate (IMS), polyimide film (example commercial brands include Kapton, Pyralux), polyethylene terapthalate (PET), ceramic or other commercially available substrates of thickness 1 µm to 3000m. Thicknesses from 500 µm to 2000 um may be preferred in some uses.

The electrode arrays may also be made of conductive and semiconductive elements fabricated with active matrix technologies and passive matrix technologies such as thin film transistor (TFT) technology. The electrode arrays may also be made of arrays of pixels fabricated with traditional CMOS or HV-CMOS fabrication techniques.

The electrode arrays may also be fabricated with transparent conductive materials such as indium tin oxide (ITO), aluminum doped zinc oxide (AZO), fluorine doped tin oxide (FTO) deposited on sheets of glass, polyethylene terapthalate (PET) and any other insulating substrates.

The electrode arrays may also be fabricated with metal deposited on glass, polyethylene terapthalate (PET) and any other insulating substrates.

Figure 6A:
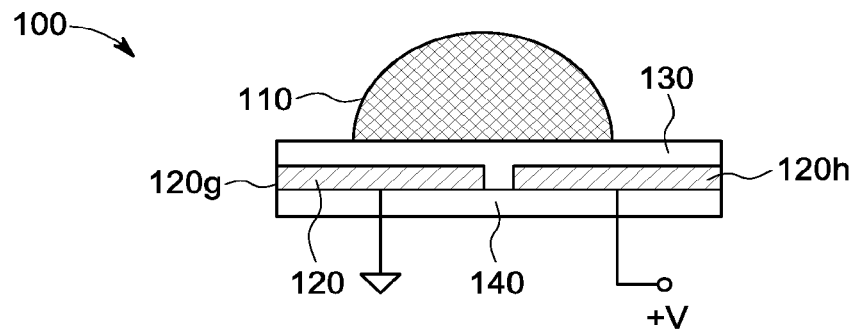

Referring to FIG. 6(a), in some cases, the electrowetting microfluidic device 100 may be composed of coplanar electrodes (electrodes on same layer) with no second plate, and the droplet 110 may ride on an open surface above the plane of the electrodes. In this configuration the reference electrodes 120g (usually ground signal) and actuation electrodes 120h are on the same plane, laid on a printed circuit board substrate, with a thin insulator above the electrodes. Droplets ride on this insulator layer, and are not sandwiched between two plates. In these cases, sometimes the reference electrode 120g is of a different geometry compared to the actuation electrode. In most cases, dielectric elements or layers are placed so that the droplets 110 never come into contact with electrodes 120 of differing polarity, so that the droplets are only exposed to electric fields, not electric current.

Figure 6B:
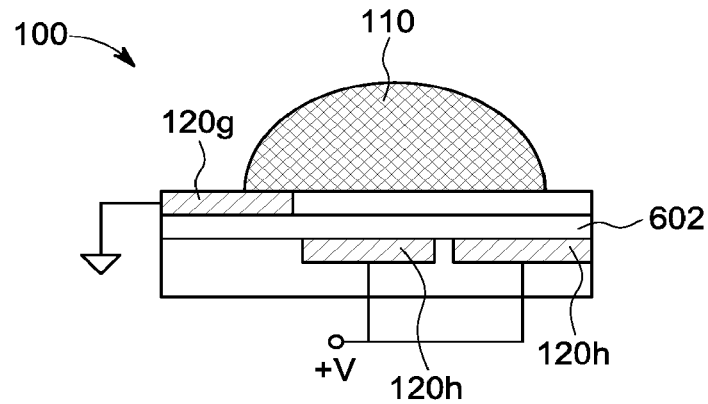

Referring to FIG. 6(b), in some cases, the electrowetting microfluidic device may be composed of two layers of electrodes (one for reference electrode 120g and one for actuation electrodes 120h), one atop the other within the substrate 140 (as opposed to a sandwich of electrodes with the droplet between plates). Here a droplet 110 may ride on an open surface and sits above both layers of electrodes. The two layers of electrodes 120g, 120h are typically spaced apart by a very thin layer 602 of insulator (10 nm to 30 p.m). Usually, the layer with reference electrode 120g is closer to the droplet. Sometimes the reference electrode 120g on the topmost layer is directly in contact with a droplet. The reference electrode layer may be less than 500 nm in thickness and may be coated with hydrophobic materials. The second layer with reference electrode may be a single continuous trace of any arbitrary shape.

Figure 6C:
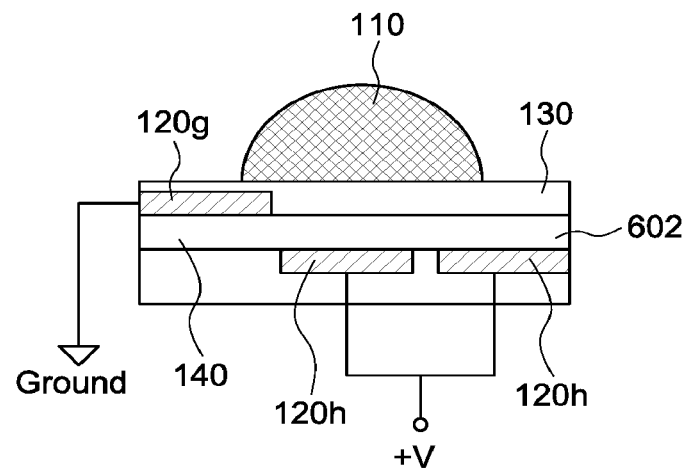

Referring to FIG. 6(c), in another configuration, the layers from top down may be arranged as a hydrophobic/insulating layer 130, a layer with electrodes 120g (typically reference or ground), a dielectric layer 602, a layer of actuation electrodes 120h, and the insulting circuit board substrate 140. The droplets 110 ride on the top open surface hydrophobic/insulating layer 130. Because the electrodes 120 are usually metallic, it may be desirable that they all be covered with an insulator or dielectric 130, to prevent chemical reactions between the droplets 110 and the electrodes.

In constructing the electrowetting microfluidic device 100, many layers of laminations (1-50 layers) may be used to isolate multiple layers of electrical interconnect routing (2-50 layers). One of the outermost layers of lamination may contain electrode pads 120 for actuating droplets and may contain reference electrodes. The interconnects may connect the electrical pads to high voltages for actuation and for capacitive sensing. The actuation voltage may be between 5V and 350V. This actuation voltage may be an AC signal or DC signal.

II.B. Creating Smooth Dielectric Surface on the Electrode Array

In order to isolate the droplet electrically from the electrode array, a layer of dielectric 130 may be applied on the top surface of the electrode array 120. Preferably, the top surface of this dielectric layer 130 may be formed with a top surface that offers little to no resistance to droplet motion, so that droplets may be moved with low actuation voltages (less than 100V DC, less than 80V, less than 50V, less than 40V, less than 30V, less than 20V, less than 15V, less than 10V, or less than 8V, depending on the degree of smoothness, slipperiness, and hydrophobicity). To achieve a low resistance slippery surface, the dielectric surface may have a smooth surface topography and may be hydrophobic or otherwise offer low adherence to the droplet.

A smooth topography surface is typically characterized by its roughness value. By experimentation, it has been found that the voltages required to effect droplet motion vary as the surface becomes smoother. Smoothness of 2 μm, and 500 nm may be desirable.

A smooth dielectric surface above the electrode arrays may be formed by some combination of techniques such as:
1. A two-step process where the surface defects are patched to achieve a relatively smooth surface and then covering it with a dielectric material. Patching the defects is typically done with a photoresist, epoxy or potting compound. The second layer of dielectric may either be the same material or a polymer film.
2. A second method is to deposit excess photoresist or epoxy on the electrode array and then polish the excess material down to required thickness and surface roughness.
3. A third method is to stretch and bond a thin polymer film on to the surface.

To prevent the droplet from adhering to the smoothed dielectric surface 130, the surface may be further modified to make it slippery by one or more of the following methods:
1. Modifying the surface chemistry
2. Modifying the surface topography
3. Applying a slippery liquid coating. Here we also introduce a new electrowetting mechanism which we call liquid-on-liquid electrowetting (LLEW).

The following section describes in details various methods to modify the rough non-slippery surface of electrode array into a smooth slippery surface.

II.B.1. Smoothing with Photoresist/Epoxy/Potting Compound

Figure 7A:
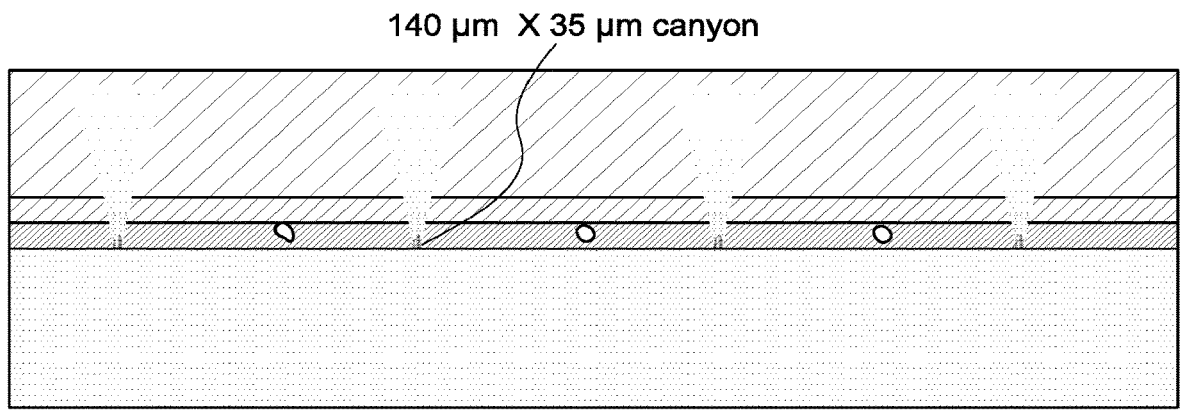
FIGS. 7(*a*) and 7(*b*) are photographs in side section of printed circuit boards.
Figure 7B:
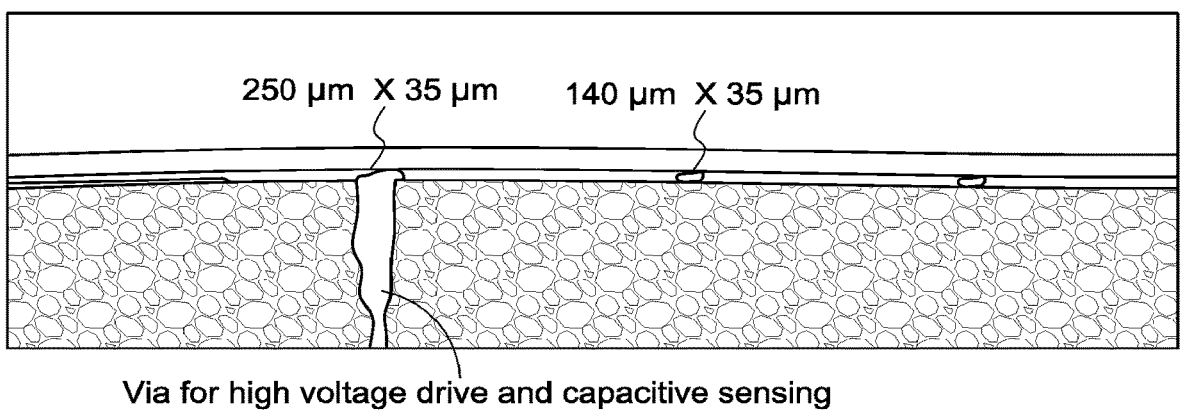

Referring to FIGS. 7(*a*) and 7(*b*), printed circuit boards (PCBs) manufactured by typical processes have surface roughness in the form of: canyons (gaps) between electrodes, holes for establishing connection between multiple layers (also known as vias), holes to solder through-hole components and any other imperfections from manufacturing errors, and the like. Typical dimensions of surface imperfections are in the range of 30 μm to 300*m*, and may be as small as varying based on the fabrication process.

Several methods may be used singly or in conjunction to reduce these surface imperfections, to achieve a planar surface of roughness value less than 1 μm, more or less, which in turn, may provide desirable wetting properties and behavior, at lower voltages.

A smooth surface may be achieved by flowing photoresist, epoxy, potting compound or liquid polymers between canyons. A photoresist of interest may flow between canyons of size less than 10 μm in any dimension and has a dynamic viscosity less than 8500 centipoise. Commercially available SU-8 photoresist is a good example of this. A suitable liquid polymer for this purpose is liquid polyimide.

Referring to FIG. 8(*a*), to fill canyons between electrodes 120, an approximately planarized surface 802 of an electrode array may be achieved by applying a coating 804 of photoresist, epoxy, potting compound, liquid polymer, or other dielectric. The material should have gap-filling properties that allows it to flow into small gaps (for example, 100 μm (width)×35 μm (height)), and to fill larger gaps. The coating may then be cured to achieve a surface of roughness value in the desirable range, 1 μm more or less. The metal electrode surface may be exposed or covered with the coating.

(a) Creating a Dielectric on the Smooth Photoresist/Epoxy/Potting Compound

Once the surface imperfections are patched up by flowing a photoresist or epoxy or potting compound 804, the topmost surface of the electrode array is more or less planarized. The approximately planar surface may have metal electrodes 120 that need additional dielectric coating 810 to isolate a droplet from a charged electrode, while allowing the electric field to propagate to where the droplet may still be influenced by the electric field. The thickness of this coating 810 may range anywhere between 10 nm to 30 μm. The dielectric layer 810 is formed as a thin film by various deposition thin films via various coating methods, by bonding a polymer film as described next or by any other thin film deposition techniques.

(i) Deposit Thin Film Coatings as Dielectric

Referring to FIG. 8(*b*), the top planarized surface 802 (exposed metal electrode 120 and photoresist from the first application, 804 of FIG. 8(*a*)) may be coated with an additional layer of the same photoresist (or epoxy or potting compound) material, or a different material with different dielectric, bonding, and smoothing properties to create the dielectric layer 810 that electrically isolates droplets from the electrodes. The photoresist may be applied by spin coating, spray coating or dip coating.

The planarized surface 802 may also be coated with thin film 810 of dielectric by some form of chemical vapor deposition. Often this kind of deposition results in the film following the topography of the coated surface. A class of material commercially available for vapor deposition are called conformal coating materials and are well suited for scalable manufacturing. Conformal coating materials include Parylene conformal coating, epoxy conformal coating, polyurethane conformal coating, acrylic conformal coating, fluorocarbon conformal coating. Other coating materials that may be used with vapor deposition include silicon dioxide, silicon nitride, hafnium oxide, tantalum pentoxide and titanium dioxide.

(ii) Bond Polymer Films to Form Top-Most Dielectric

Referring to FIG. 8(*c*), the top planarized surface 802 (metal electrode 120 and photoresist 804) may be covered with an additional layer of polymer film 816 to isolate the droplet from the electrodes. The film 816 may be stretched to eliminate wrinkles, and ensure additional smoothness.

The polymer film may be held on the electrode array by heat bonding or by vacuum suction or by electrostatically sucking it down or simply by mechanical holding it in place.

II.B.2. Using Excess Photoresist and Polishing to a Smooth Dielectric Surface

Figure 8A:
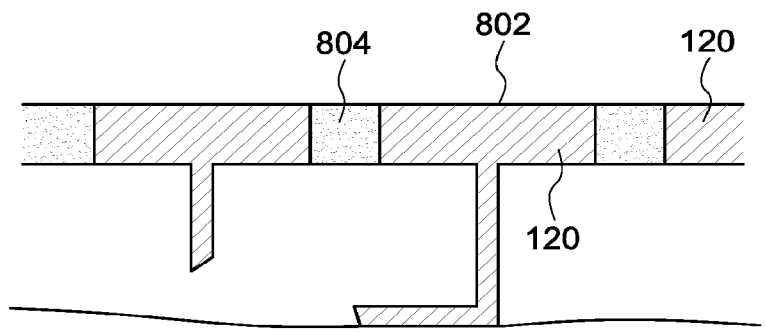
FIGS. 8(*a*), 8(*b*), 8(*c*), 8(*d*), 8(*e*), 8(*f*), 9(*a*), and 9(*e*) are side section view of printed circuit boards.
Figure 8B:
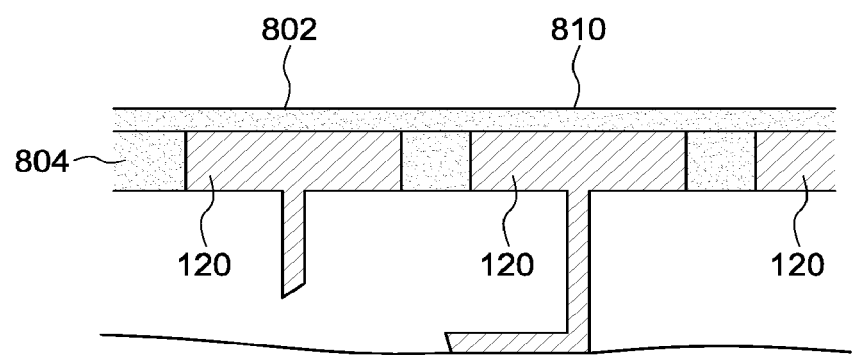
Figure 8C:
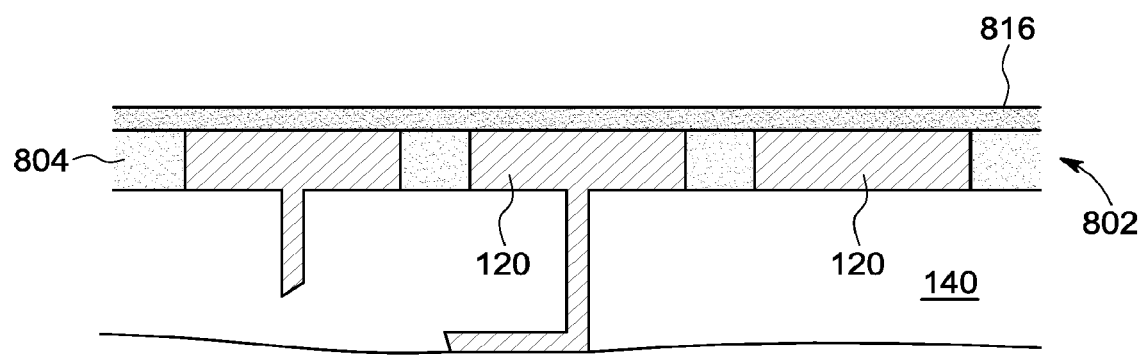
Figure 8D:
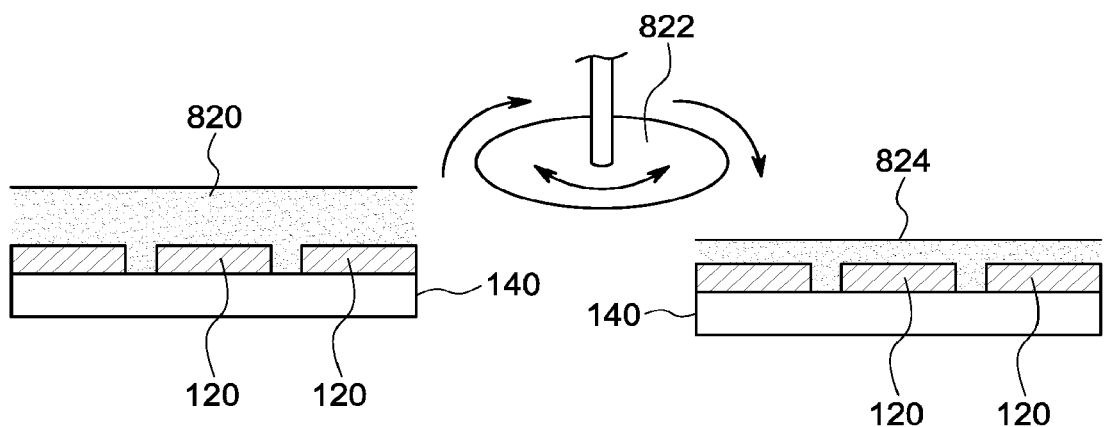

Referring to FIG. 8(d), a smooth dielectric surface may be achieved by coating the electrode array with a photoresist or other curable dielectric materials 820 and then polishing 822 the topmost surface to achieve a smooth surface 824. The photoresist/dielectric material may be coated using techniques such as spin-coating, spray coating, vapor deposition or dip coating.

The first step in this process may be to coat the electrode array 120 with a curable dielectric to a thickness 820 significantly higher than the height of the electrode. For example, if the electrode measures 35 µm in height, the dielectric coating thickness above the top surface of the electrode may be at least 70 i.t.m. The dielectric may then then be polished 822 with a fine abrasive and a chemical slurry using a polishing pad typically larger than the electrode grid array. The polishing process may be continued until the dielectric above the electrode is of desirable thickness (500 nm to 15 µm) above the electrode. Typically the polishing step also smoothes the surface to a surface roughness of roughness value less than 1 µm, and more preferably to smoother than 500 nm, or 200 nm, or 100 nm. After polishing, a follow-up with a hydrophobic coating may be desirable. The thin smooth surface with or without hydrophobic coating may provide sufficient electrowetting forces to move droplets at lower voltages.

II.B.3. Polymer Film as a Smooth Dielectric Surface

Figure 8E:
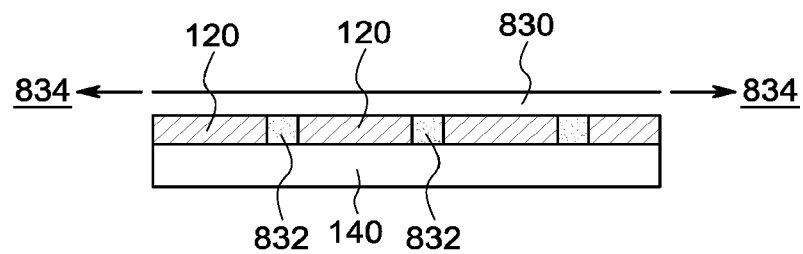

Referring to FIG. 8(e), in some cases, a thin polymer film 830 (1 µm to 20 µm) may be used to form a smooth dielectric surface directly above the electrode array. In this case, pre-processing is not required to patch some of the canyons with a photoresist, epoxy or potting compound—these cavities 832 may be left filled with air. Instead, the film may be applied directly to the unmodified electrode surface. In these cases, the film is first stretched 834 to remove any wrinkles and is then bonded to the surface of the electrodes. Polymers films of low surface free energy may be used for such use. Many fluorinated polymers such as PTFE (polytetrafluoroethylene), ETFE (ethylene tetrafluoroethylene), FEP (fluorinated ethylene propylene), PFA (perfluuoroalkoxy alkane) are other fluoropolymers with low surface energy may be suitable for electrowetting. Polydimethylsiloxane (PDMS) is another material with low surface energy that may be used as dielectric for electrowetting. These low surface energy polymer films may sometimes need an additional layer of hydrophobic material to reduce the surface energy further for low adhesion and good electrowetting droplet motion. Films made from polymers with slightly higher surface free energy such as polypropylene, polyimide, Mylar, polyvinylidene fluoride (PVDF) are also suitable for electrowetting, however they might require an additional hydrophobic material coating or surface modification to aid droplet motion.

II.C. Creating a Final Slippery Surface Finish

A surface of an electrowetting microfluidic device may be further treated to reduce or eliminate adherence of the liquid droplet to the top surface. This additional treatment may permit a droplet to be repeatedly moved from one location to another by lower actuation voltages. To turn the smooth dielectric surface into a slippery, low-adherence surface for a droplet, the surface of the dielectric material may be turned into a hydrophobic surface via chemical modification or surface topography modification. Alternatively, this slippery surface may be created by creating a thin layer of lubricating liquid on the smooth dielectric or directly on the electrode array. The hydrophobic coating material may be such that a 1 µl droplet on a surface tilted at angle of 3° or more slides away. The following section will describe these methods in detail.

II.C.1. Modifying Solid Dielectric to Achieve Hydrophobicity

In some cases, the smooth dielectric surface may not have sufficiently low surface energy to allow for droplet motion induced by electrowetting. To reduce the surface energy further, the dielectric surface may be modified chemically or topographically.

(a) Surface Chemistry Modification (Functionalization)

Figure 8F:
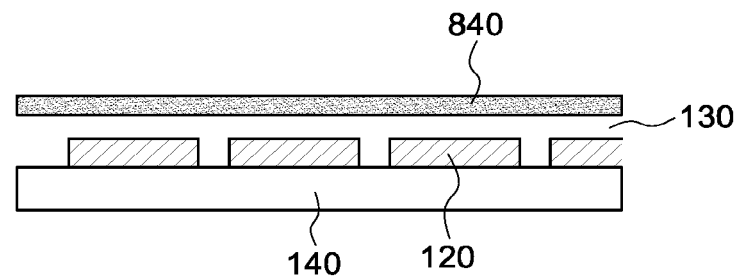

Referring to FIG. 8(f), the surface energy may be reduced by chemical modification, for example, by coating over the electrodes 120 and/or dielectric 130 with hydrophobic or low-surface energy materials 840 such as fluorocarbon based polymers (fluoropolymers) or other hydrophobic surface coating. The hydrophobic coating may be applied by spin coating, dip coating, spray coating or chemical vapor deposition, or other methods.

In some cases, it may be desirable to choose a fluorocarbon conformal coating that may act as both a dielectric (to insulate the droplets from the charge of the electrical pads while allowing the electric field to propagate) and as a hydrophobic coating (to reduce adhesion and allow smooth droplet motion)

(b) Surface Topography Modification

To induce hydrophobicity on the surface of the dielectric, its topography may be modified at a microscopic level. Such modifications may include patterning the surface to create microscopic pillar (micropillars) or deposition of microspheres.

(i) Creating Micropillars

Figure 9A:
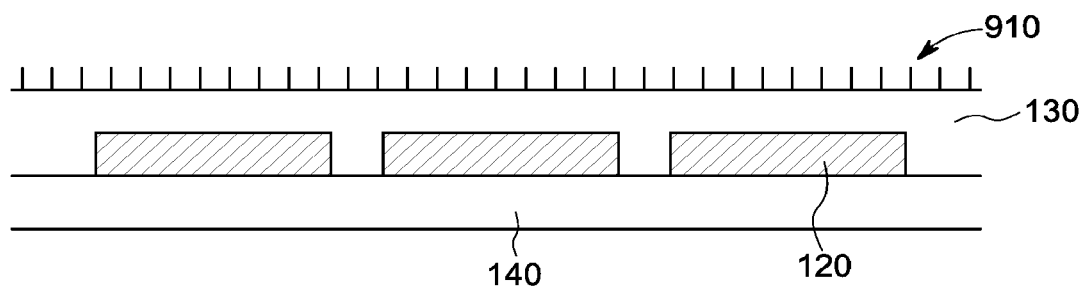
FIGS. 9(*b*), 9(*c*), and 9(*d*) are views of a manufacturing process.

Referring to FIG. 9(a), micropillar structures 910 may be created on a film of dielectric layer 130. This topmost layer over the electrode array acts as hydrophobic surface.

Figure 9E:
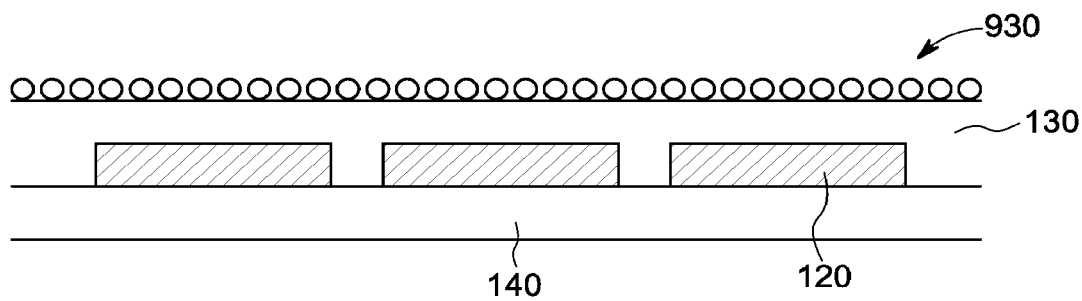
Figure 9B:
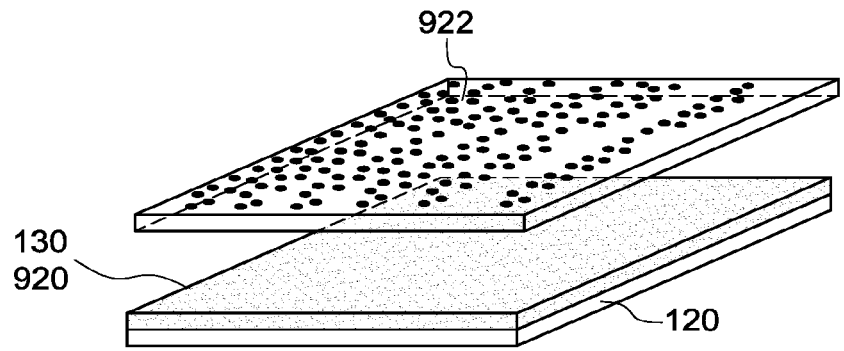
Figure 9C:
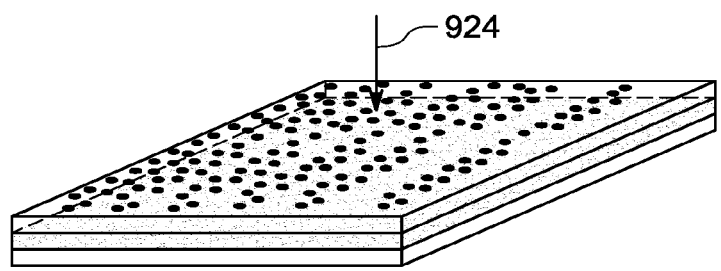
Figure 9D:
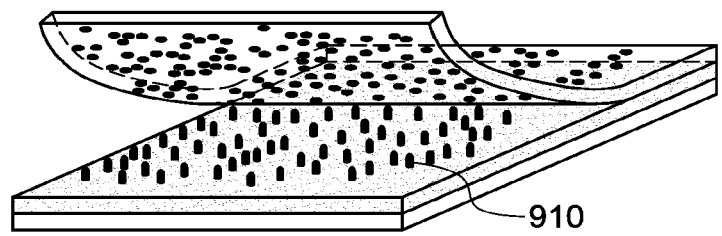

Referring to FIGS. 9(b), 9(c), and 9(d), micropillar structures may be created by first heat bonding polymer films 920 of polypropylene, polytetrafluoroethylene (PTFE), Mylar, Ethylene tetrafluoroethylene (ETFE), fluorinated ethylene propylene (FEP), perfluoroalkoxy alkane (PFA), other fluoro-carbon based polymers, or other low-surface energy polymers, as a dielectric over the electrodes. The polymer surface may be pressed against a micropillar template 922, such as a polycarbonate membrane that has holes of dimension 1 µm to 5 µm (or other porous membrane as templates). Referring to FIG. 9(c), with heat and pressure 924, the polycarbonate micropillar template may impress itself into the dielectric film. Referring to FIG. 9(d), when the polycarbonate membrane is peeled away, it leaves microscopic pillar like structures 910.

In another alternative, micropillar structures 910 may be created with polydimethylsiloxane (PDMS) elastomer on the planarized electrode array (after the electrode array is planarized). In this method the PDMS elastomer may be cast as a thin film through a spin coating method. The polycarbonate membrane may then be pressed against the PDMS surface. The PDMS membrane may be cured to solidify. The polycarbonate membrane may then be dissolved.

In another alternative, a polymer (ETFE, PTFE, FEP, PFA, PP, Mylar, PVDC) or elastomer (PDMS, Silicone) may be bonded to the electrode array, and then etched with laser to create micropillars.

In another alternative, a photoresist material may be deposited on to the electrode array, and then etched with laser to create micropillars. The photoresist may also be patterned and etched using photolithography techniques.

(ii) Microspheres

Referring to FIG. 9(e), an alternate method for modifying topography to achieve a slippery or low-adherence surface is by depositing microspheres 930 of particle size 200 nm to 2 i.t.m. The microspheres may be tightly packed to make the surface hydrophobic. A good candidate for such microsphere particles is silica beads. In order to make the surface slippery, these microspheres may be covered by organofunctional alkoxysilane molecules. Alternately, fluorocarbon-based microspheres (PTFE, ETFE) may be deposited and may not need additional coating.

II.D. Slippery Liquid Coating and Liquid-On-Liquid Electrowetting (LLEW) II.D.1. Droplets on Thin Film Liquid Layer in LLEW In LLEW, a droplet may ride on a thin film of lubricating, low surface energy oil. The thin film of oil may be formed on a low surface energy textured solid surface. The textured solid and the lubricating oil may be selected such that the lubricating oil prefers to wet the solid entirely, and preferentially remains non-interacting with the liquid of the droplet. Once the bulk of the textured solid is filled with oil, a thin layer of oil is formed just above the oil filled body. The self-leveling nature of the oil layer on the top may hide any non-uniformities in the topography of the underlying surface. Thus, a surface of an electrode array with very high roughness (tens of micrometers) may be translated to a nearly-molecular-level smooth surface with a thin film of lubricating oil.

This molecular-level smooth surface may offer very little friction to droplet motion, and droplets may experience little to no droplet pinning. Droplets on such a smooth surface may have very small contact angle hysteresis (as low as 2°). The resulting low contact angle hysteresis and absence of droplet pinning may lead to very low actuation voltage (1V to 100V) with robust droplet manipulation.

Oil in the bulk of the solid may be trapped within irregularities or pores that make up the texture of the solid. As opposed to a layer of oil on a smooth textureless surface, oil in a textured solid may have sufficient affinity for and molecular interaction with the solid's surface to reduce influence of gravity. The trapping of the oil within the texture may allow the surface to retain its oil layer and its characteristics when inclined or upside down. Since the oil does not leave the surface of the solid, the droplet being moved rides on the lubricating oil and it interacts only with the surface of the lubricating oil and not with the underlying textured solid. As a result, the droplet may leave little to no trail on the underlying solid. If the oil is immiscible with the droplet, a droplet may move on the liquid film layer without any contamination between two consecutive droplets crossing paths.

The textured solid may be made of regular or irregular micro-textures. Examples include:

A solid with regularly spaced microscopic pillar structures, with micron-scale spacing.
A solid with regularly spaced voids; the voids may be of any arbitrary shape.
A random matrix of fibers.
A solid with irregularly spaced microscopic pillar structures, with micron-scale spacing.
A solid with randomly spaced voids; the voids may be of any arbitrary shape.
A porous material such as porous Teflon, porous polycarbonate, porous polypropylene, porous paper and porous fabric may be used as irregular or regular micro-textured solid.

The lubricating oil may be any low-energy oil such as silicone oil, DuPont Krytox oil, Fluorinert FC-70 or other oil. The lubricating oil may be selected such that the oil is immiscible with the liquid droplets. A lubricant that is immiscible with the droplet solvent may improve the ability of the droplet to ride over the lubricant or oil with less diffusion of contents from the droplet into the oil and vice-versa. The viscosity of the lubricating oil affects droplet mobility during electrowetting; with lower viscosity promoting higher mobility. Suitable lubricating oils are generally non-volatile and immiscible with the riding droplet of interest. If the droplet contains biological constructs, a biocompatible oil may be desirable. In a LLEW device with on-chip heating elements for incubation and for thermocycling (for example, for polymerase chain reaction), the oil may be selected to withstand heating and high temperatures. An oil with sufficiently high dielectric constant may reduce actuation voltage that induces droplet motion.

II.D.2. Creating Textured Solid for LLEW

In LLEW, the oil-filled textured solid may act as an electrical barrier between the electrode array and liquid droplet and may also provide the slippery surface for droplet motion. There are a number of different ways in which textured dielectric surface may be created on an electrode array.

A textured solid surface may be formed on an electrode array by binding a polymer or other dielectric material as a film. The film itself may be textured before bonding to the electrode array. Alternatively, a non-textured film may be bonded on to the electrode array, and then textured either by laser etching, chemical etching or photolithography techniques.

Alternatively, a layer of photosensitive material such as a photoresist (SU-8) may be coated onto the electrode array. The photoresist may be patterned by chemical etching, laser etching or any other photolithography techniques.

Alternatively, textured solids may be created by coating very thin layers of elastomeric material such as PDMS onto the electrode array and then using soft lithography techniques to selectively create pores. Following the creation of a thin elastomeric layer, the surface of the PDMS may also be laser etched to create textures.

Alternatively, textured solids may be created as follows
Applying a conformal coating or liquid photoimageable (LPI) solder mask or dry film photoimageable solder mask
Etching the surface of this coating with a laser or by physical stamping.
Growing a mesh of polymer substance directly on the electrode array.
Growing one molecule at a time to achieve the required structure.

II.D.3. Applying Lubricating Oil onto the Textured Solid

The textured solid layer may be filled with lubricating oil by spin-coating, spraying, dip-coating, brushing, or by dispensing from a reservoir.

The lubricating oil may be kept from flowing out of the LLEW chip by creating physical or chemical barriers at the periphery of the device.

III. Unique Properties of Liquid-On-Liquid Electrowetting (LLEW)

The LLEW array has two unique properties that are desirable for biological sample manipulation. The electrowetting actuation voltage may be lowered significantly because a LLEW array has such a smooth surface. Additionally, the LLEW surface architecture reduces cross-contamination between samples by lowering the trail droplets leave behind as well as improving cleaning mechanism.

III.A. Low Actuation Voltage

A nearly molecular level smoothness of oil surface on an LLEW electrode array may reduce or eliminate droplet pinning. A droplet made of an aqueous solution riding on the oil surface may experience little to no drag from the surface and hence a small difference between the advancing and receding angle. The elimination of these two phenomena may result in low actuation voltage. Droplets may be actuated at voltages as low as 1V.

In a LLEW device, a droplet riding on a thin layer of oil never physically comes in contact with the solid dielectric substrate below the oil. This may reduce or eliminate the amount of material left behind and hence cross-contamination between samples that go over the same spot.

III.B. Cleaning by Washing an LLEW Device Surface

When a LLEW device is contaminated with a solid particle such as dust, a droplet may be maneuvered over the contaminant to remove the contaminant from the liquid film surface as a part of a cleaning routine. This cleaning routine may be further extended to clean the entire surface of electrowetting device. For example, a cleaning routine may be used between two biological experiments on a LLEW microfluidic chip to reduce cross contamination. In some cases, when a droplet stays at a location for a long period of time, a few molecules may diffuse from the droplet into the oil below. Any residue left behind by a droplet through diffusion may also be cleaned with similar washing routines.

As droplets are transported on a LLEW device, the droplets may carry and deplete the oil film from the surface. The oil on the surfaces may be replenished by injecting oil from an external reservoir; for example, from an inkjet cartridge, syringe pump or other dispensing mechanisms.

The lubricating oil surface may be washed away entirely and replaced with a fresh layer of oil to prevent cross contamination between two consecutive experiments.

IV. Applications of Electrowetting

IV.A. Arbitrarily-Large Open Face

Droplets may be manipulated on an open surface, without sandwiching them between the electrode array and a cover plate (either a neutral glass, or an upper electrode array, or simply just a large ground electrode). Sometimes a cover plate above the droplet may be used that does not physically make contact with the droplet.

Electrode arrays and electrowetting on an open surface and arbitrarily large area allows for actuation of droplets of volumes between 1 nanoliter and 1 milliliter (6 orders of magnitude apart). This implementation shows multi-scale fluid manipulation digitally on a single device.

Two-dimensional arrays (grids) of electrodes of arbitrarily-large size may be prepared for electrowetting droplet actuation. Two-dimensional arrays allow for multiple paths for droplets compared to prescribed one-dimensional tracks. These grids may be leveraged to avoid cross-contamination between droplets of two different compositions. For example, a two-dimensional grid may allow for multiple droplets actuated in parallel. Droplets carrying different solutes may be run on separate parallel tracks to reduce contamination. Multiple distinct biological experiments may be run in parallel.

IV.B. Droplet Motion, Merging and Splitting

A droplet may be moved, merged, and/or split on an open surface electrowetting device. The same principles apply to two plate configuration (droplet sandwiched).

FIGS. 10(a), 10(b), and 10(c) show motion of a droplet 110 on an array of electrodes 120. In FIG. 10(a), applying a voltage to an electrode 120i makes the overlying surface hydrophilic and a droplet can then wet in. When voltage is removed from electrode 120i and applied to another adjacent electrode 120j, the surface returns to original hydrophobic state and the droplet is pushed out, as shown in FIG. 10(c). By sequentially controlling the voltage applied to an electrode grid, a droplet's position on a surface may be precisely controlled.

Referring to FIGS. 10(d), 10(e), and 10(f), two droplets may be merged. When two droplets are pulled towards the same electrode 120k, they naturally merge due to surface tension. This principle can be applied to merge a number of droplets to create a larger volume droplet spreading across multiple electrodes.

Referring to FIGS. 10(g), 10(h), and 10(i), a droplet may be split into two smaller ones through a sequence of voltages, applied across multiple electrodes (at least three). In FIG. 10(g), a single large droplet is consolidated above a single electrode 1201. In FIG. 10(h), an equal voltage is applied to three adjacent electrodes simultaneously, and this causes the single droplet to spread across the three adjacent electrodes. In FIG. 10(i), turning off the center electrode 1201 forces the droplet to move out to the two outer electrodes 120m, 120n. Due to the equal potential on both of the two outer neighboring electrodes, the droplet then splits into two smaller droplets.

IV.C. Lab in a Box (Desktop Digital Wetlab)

Any combination of the manufacturing methods described so far may be used for the application described in this section.

Figure 11A:
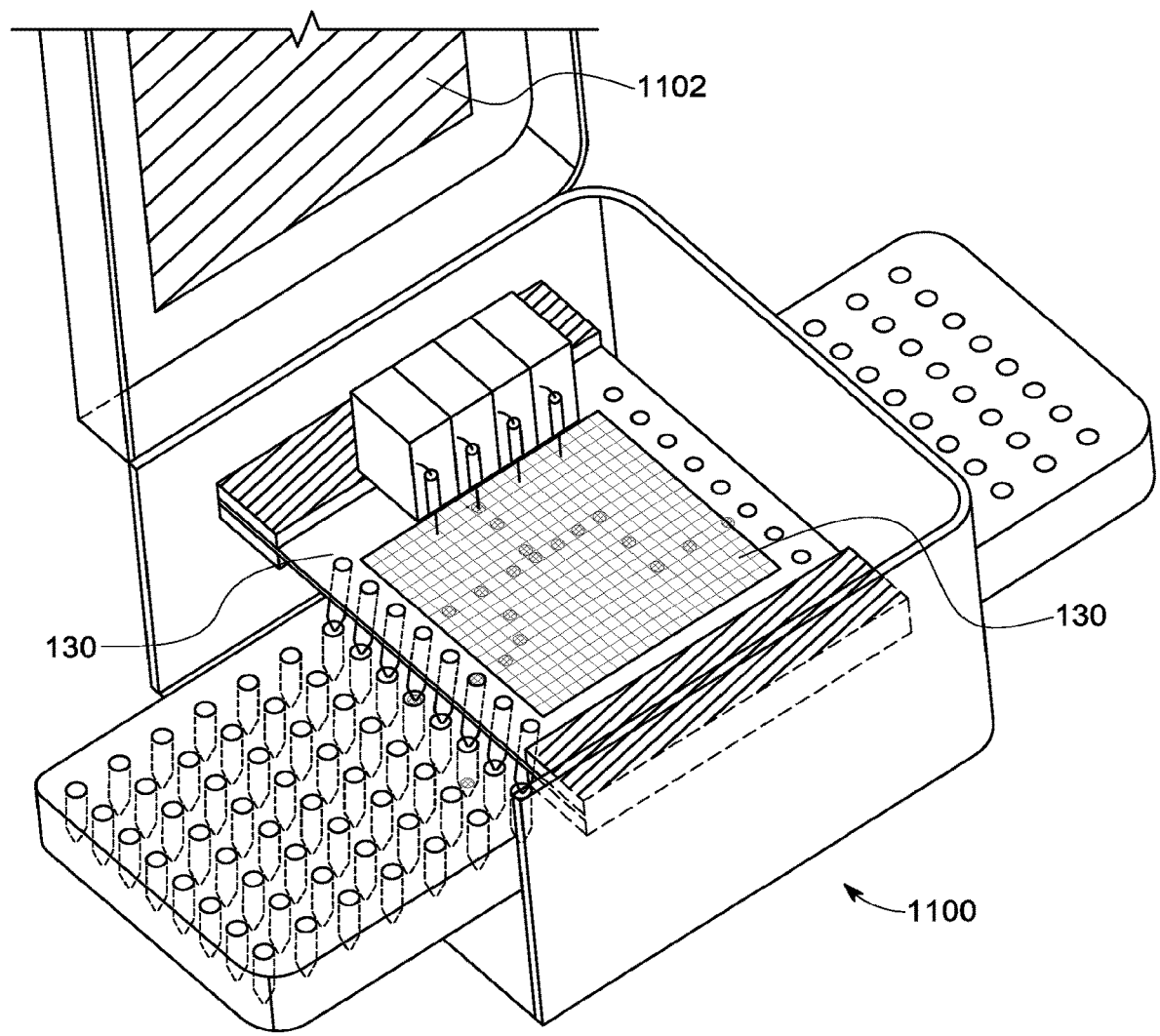
FIG. 11(*a*) is a perspective view of a laboratory apparatus.
Figure 11B:
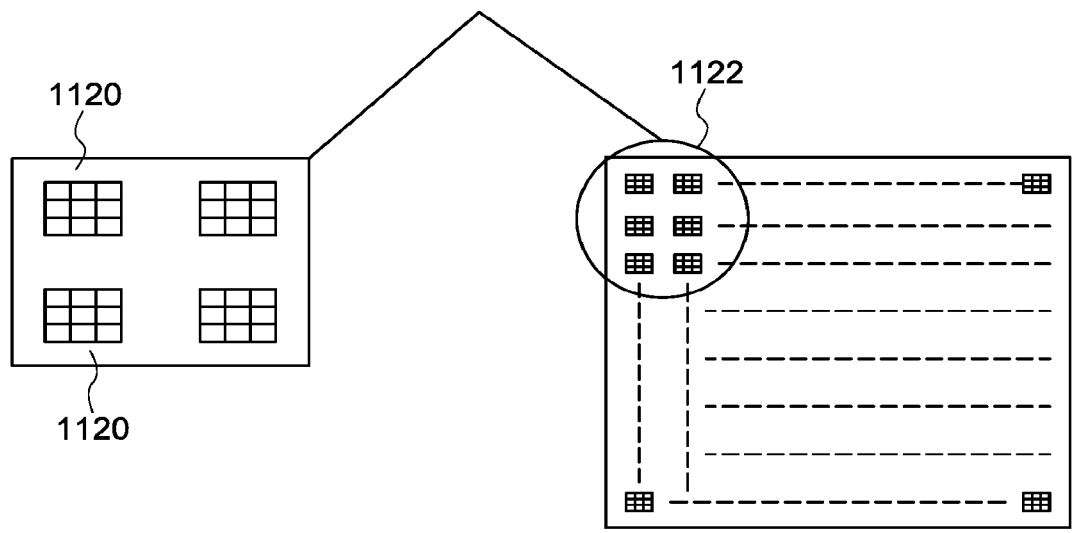
Figure 11C:
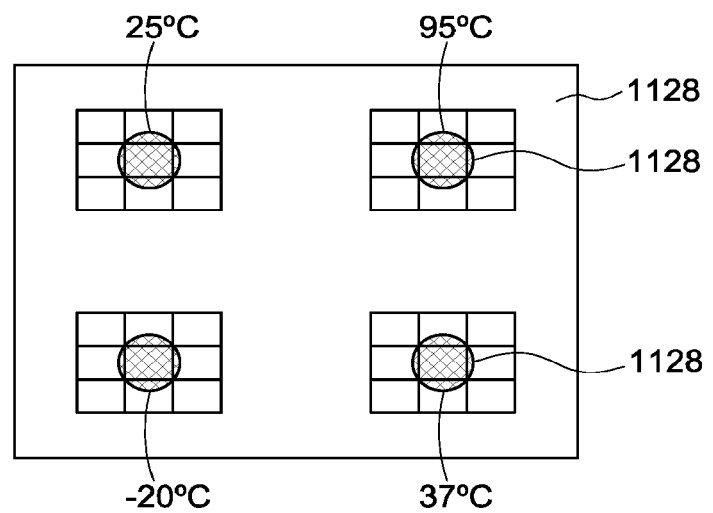
Figure 11D:
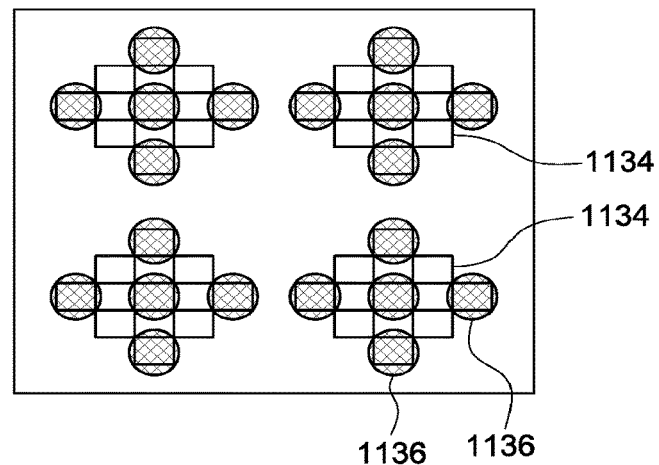
Figure 11E:
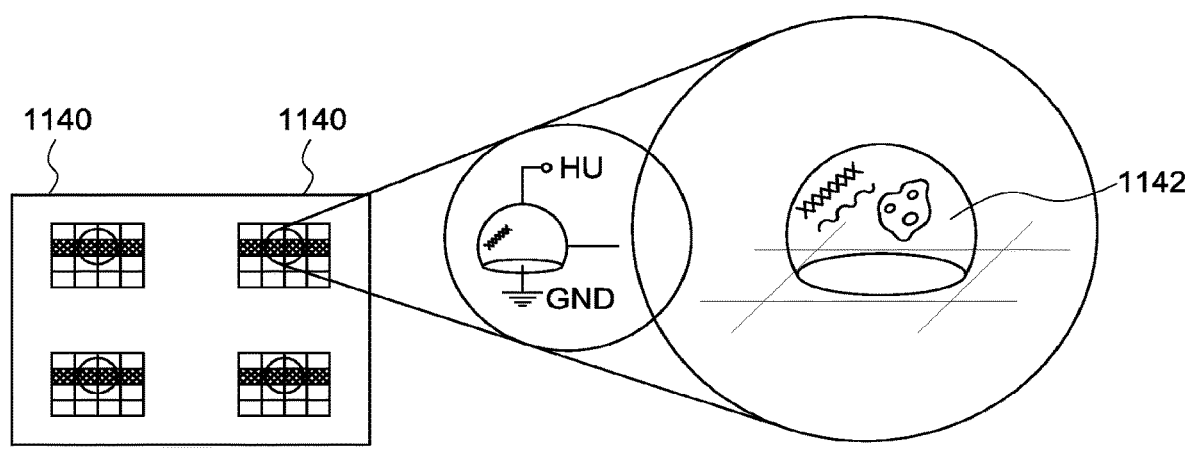

FIG. 11(a) shows a digital microfluidic based "desktop digital wetlab" 1100. This device may provide a general purpose machine that may automate a large variety of biological protocols/assays/tests. The box may have a lid that can be opened and closed. The lid may have a clear window 1102 to view the motion of droplets on the electrode array, which may be formed as a digital microfluidic chip. The box may house a digital microfluidic chip 100 capable of moving, merging, splitting droplets, in which the droplets carry biological reagents. The microfluidic chip may also have one or more heaters or chillers 1128 that may be able to heat droplets to as high as 150° Celsius or cool the droplets to as low as −20° Celsius.

Droplets may be dispensed onto the chip through one or more "liquid dispenser" droppers. Each liquid dispenser may be an electro-fluidic pump, syringe pump, simple tube, robotic pipettor, inkjet nozzle, acoustic ejection device, or other pressure or non-pressure driven device. Droplets may be fed in to the liquid dispenser from a reservoir labeled "cartridge." The "lab-in-a-box" may have up to a several hundred cartridges interfacing directly with the microfluidic chip.

Droplets may be moved from the digital microfluidic chip on to micro plates. Microplates are plates with wells that can hold samples. Microplates may have anywhere from one to a million wells on a single plate. Multiple microplates may interface with the chip in the box. To dispense droplets from the microfluidic chip to the microplate, electrowetting chips with various geometries may be used. In some cases, the dispensing chip may be in the form of a cone resembling a pipette tip. In another form, the dispensing aperture may be just a cylinder. In another form, the dispensing apparatus may be two parallel plates with a gap in between. In another form, the dispensing apparatus may be a single open surface with droplet moving on the open surface. The dispensing mechanism may also use a number of other mechanisms such as electrofluidic pumps, syringe pump, tubes, capillaries, paper, wicks or even simple holes in the chip.

The "lab-in-a-box" may be climate controlled to regulate the internal temperature, humidity and oxygen concentration. The inside of the box may be at vacuum.

The digital microfluidic chip 130 at the center of the box may be removed, washed and replaced.

The digital microfluidic device may include sensors to perform various assays, for example optical spectroscopy, or sonic transducers.

The digital microfluidic device may include a magnetic bead based separation unit for DNA size selection, DNA purification, protein purification, plasmid extraction and any other biological workflow that uses magnetic beads. The device may perform a number of simultaneous magnetic bead based operations—one to a million on a single chip.

The box may be equipped with multiple cameras looking at the chip from the top, sides and bottom. The cameras may be used to locate droplets on the chip, to measure volumes of droplets, to measuring mixing, and to analyze reaction in progress. Information from these sensors may be provided as feedback to computers that control the electrical flow to the electrodes, so that the droplets may be accurately controlled to achieve high throughput rates with accurate drop positioning, mixing, etc.

The lab-in-a-box may be used to perform microplate operations as plate stamping, serial dilution, plate replicate and plate rearray.

The lab-in-a-box may include equipment for PCR amplification and DNA assembly (Gibson Assembly, Golden Gate Assembly), molecular cloning, DNA library preparation, RNA library preparation DNA sequencing, single cell sorting, cell incubation, cell culture, cell assay, cell lysing, DNA extraction, protein extraction, RNA extraction, RNA and cell-free protein expression.

IV.D. Process Stations

An electrowetting chip (with or without a lab-in-a-box enclosure) may include one or more stations for various functions.

IV.D.1. Mixing Stations

Referring to FIG. 11(*b*), an electrowetting device may incorporate one or more mixing stations 1120. On the left is a 2×2 collection of electrowetting-based mixing stations that may be operated in parallel. A single mixer 1120 has a 3×3 grid of actuation electrodes. Each mixing station 1120 may be used to mix biological samples, chemical reagents, and liquids. For example, droplets of two reagents may be brought together at a mixing station, and then mixed by running the merged droplet around the outer eight electrodes of the 3×3 grid, or running through other patterns designed to mix the two original droplets. The center-to-center spacing between each mixer may be 9 mm, equivalent to the spacing of a standard 96-well plate.

The parallel mixing stations 1120 may be extended to have a number of different configurations. Each single mixer may be comprised of any number of actuation electrodes in an A×B pattern 1122. Additionally, the spacing between mixers is arbitrary and may be altered to fit the application (such as other SDS plates). A parallel mixing station may also have any number of individual mixers in an M×N pattern 1122. Parallel mixing stations may have any configuration of top plate including but not limited to an open face, a closed plate, or a closed plate with liquid entry holes.

IV.D.2. Incubation Station

Referring to FIG. 11(*c*), an electrowetting chip may include one or more incubation stations 1128. Each individual incubator 1128 may integrate one or more functions to be applied to liquid samples such as mixing, heating (for example, to temperatures up to 150° Celsius), cooling (for example, to −20° Celsius), compensating for fluid loss due to evaporation as well as homogenizing temperature of a sample. Heating or cooling may be accomplished by thermocouples or evaporative heat exchangers in the substrate. In some cases, the individualized heating elements may permit each station to be controlled to a separate temperature, for example, −20° C., 25° C., 37° C., and 95° C., depending on the heat transfer power of each element and the heat conduction levels between stations.

A parallel incubation station may be configured in any of the same configurations as a parallel mixing station.

IV.D.3. Magnetic Bead Station

Referring to FIG. 11(*d*), a magnetic bead wash station 1134 may contain samples with nucleic acids, proteins, cells, buffers, magnetic beads, wash buffers, elution buffers, and other liquids 1136 on an electrode grid. The station may be configured to mix samples and reagents, apply heating or other processes, in sequential order to perform nucleic acid isolation, cell isolation, protein isolation, peptide purification, isolation or purification of biopolymers, immunoprecipitation, in vitro diagnostics, exosome isolation, cell activation, cell expansion, and/or isolation of a specific biomolecule. In addition to mixing and heating of liquids, each magnetic bead station may have the ability to locally turn on and turn off a strong and varying magnetic field, which in turn causes magnetic beads to move, for example, to the bottom of the electrowetting chip. Each magnetic bead station may also have the ability to remove excess supernatant liquids and wash liquids through electrowetting forces or through other forces.

In some cases, the sample may be on an open surface with single plate electrowetting device. In some cases, the samples may be sandwiched between two plates. Multiple magnetic bead stations may be configured to be operated in parallel, as described above for parallel mixing stations.

IV.D.4. Nucleic Acid Delivery Station

Referring to FIG. 11(*e*), an electrowetting chip may include one or more nucleic acid delivery stations 1140. Each individual parallel nucleic acid delivery station may be designed to insert genetic material 1142, other nucleic acids and biologics into cells through various insertion methods. This insertion may performed by applying a strong electric field, applying a strong magnetic field, applying ultrasonic waves, applying laser beams, or other techniques. One or more nucleic acid delivery station may be configured as a singleton on an electrowetting device, or multiple nucleic acid delivery stations may be provided to operate in parallel.

IV.D.5. Optical Inspection Station

Referring to FIGS. 11(*f*) and 11(*g*), one or more optical inspection stations 1150 that use optical detection and assay methods may be provided on an electrowetting device 100. A light source 1152 (broad spectrum light, single frequency, or other) may be passed through optics 1154 to condition the light (filters, diffraction gratings, mirrors, etc.) and then illuminate a sample 1156 sitting on an electrowetting device. An optical detector on the other side of the electrowetting device is configured to detect the spectrum of light passing through the sample for analysis. The optical inspection may be used for measuring concentration of nucleic acids, measuring quality of nucleic acids, measuring density of cells, measuring extent of mixing between two liquids, measuring volume of sample, measuring fluorescence of sample, measuring absorbance of sample, quantification of proteins, colorimetric assays and other biological assays.

Figure 11F:
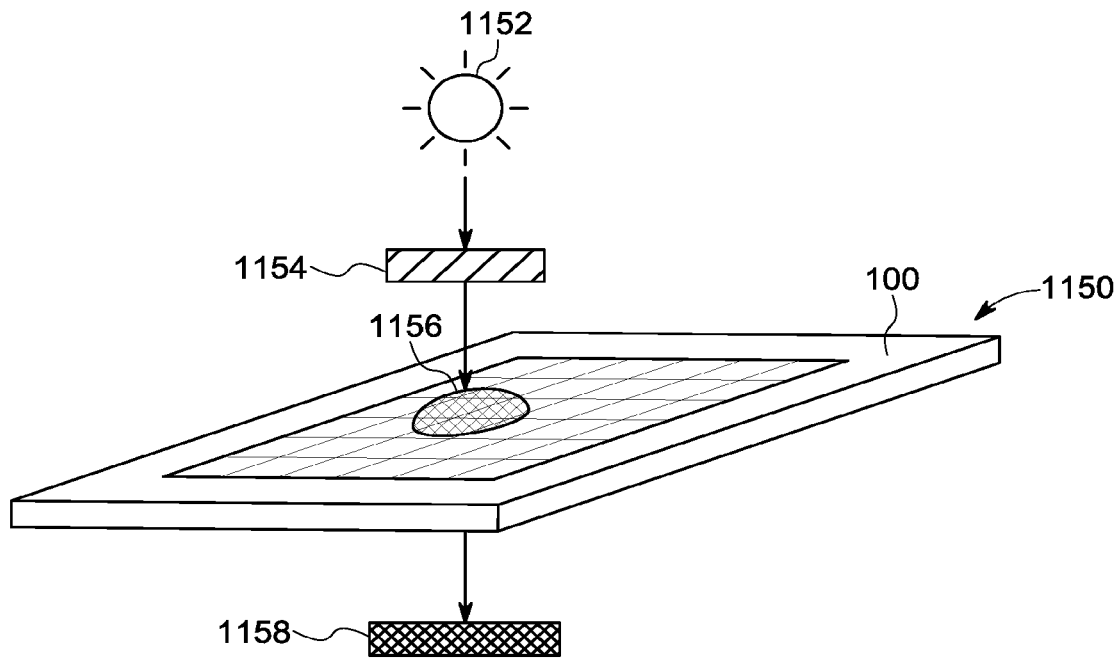
Figure 11G:
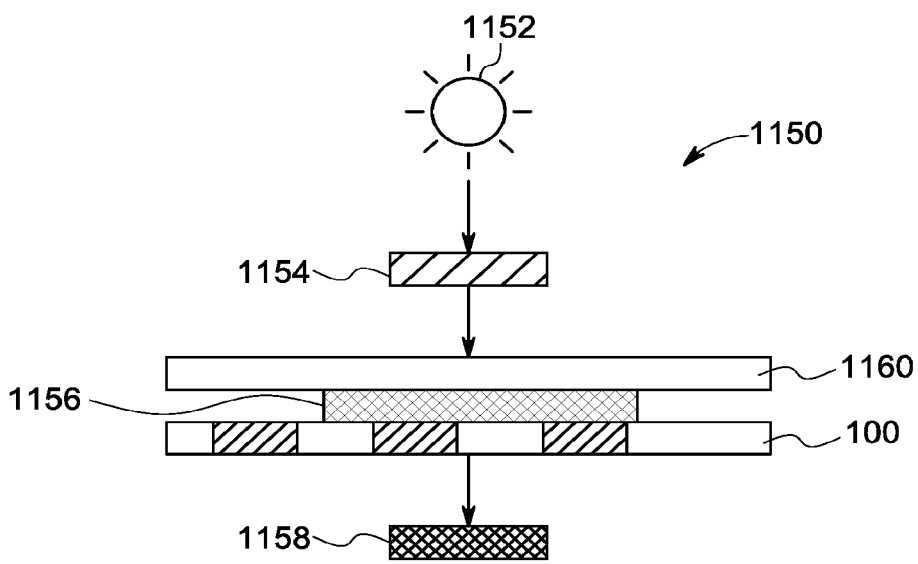

As shown in FIG. 11(f), sample 1156 may be on an open surface with single plate electrowetting device 100. As shown in FIG. 11(g), sample 1156 may be sandwiched between two plates 100, 1160. In some cases the electrowetting chip and the electrodes may be transparent. In some cases, there may be a hole in the electrode on which the sample is located, to allow passing of light from the source through the sample to the optical detector, or to introduce samples, reagents, or reactants.

Figure 11H:
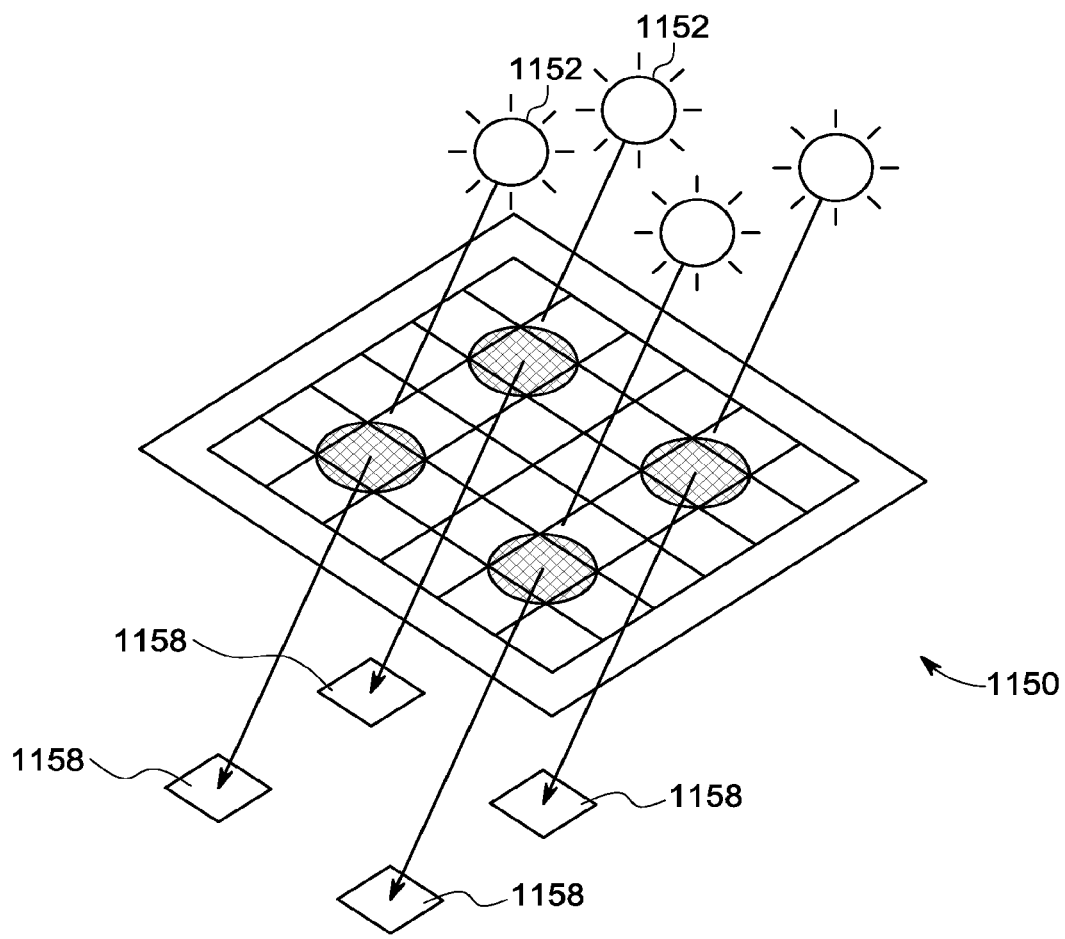

Referring to FIG. 11(h), the optical detection 1150 may be performed on samples arranged in 2×2 sample format or 96 well plate format for optical detection or any M×N format to measure up to a million samples. The samples and corresponding measurement units may be arranged in any regular and irregular format.

IV.D.6. Loading/Unloading Via Acoustic Liquid Handlers or Microdiaphragm Based Pump Dispenser Referring to FIGS. 11(i) and 11(j), an electrowetting device may include one or more stations 1160 for loading biological samples, chemical reagents and liquids from a source well, plate, or reservoir onto an electrowetting chip 100.

Figure 11I:
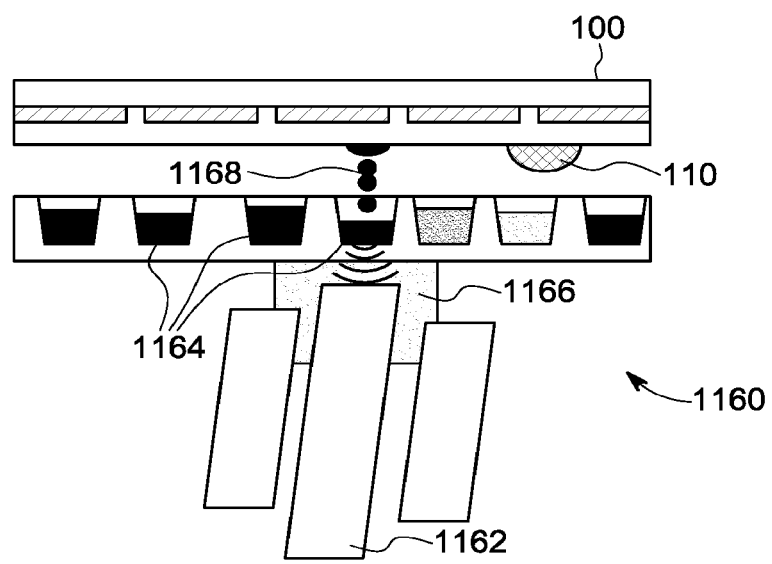

In FIG. 11(i), droplets may be loaded onto the electrowetting surface through acoustic droplet ejection. The source plate may hold liquids in wells 1164 and may be coupled with a piezoelectric transducer 1162 via an acoustic coupling fluid 1166. Acoustic energy from a piezoelectric acoustic transducer 1162 may be focused on to the sample in the well 1164. Note in FIG. 11(i), electrowetting chip 100 is on top, and is inverted. Note that Droplet 110 adheres to electrowetting chip 100 because of the additional wetting force induced by the voltage, which contributes to the droplet-sorting function of apparatus 1160. A droplet 1168 ejected from a well 1164 by acoustic energy may adhere to the upper electrowetting device 100 or may be incorporated into a droplet that has been moved to the acoustic injection station.

Figure 11J:
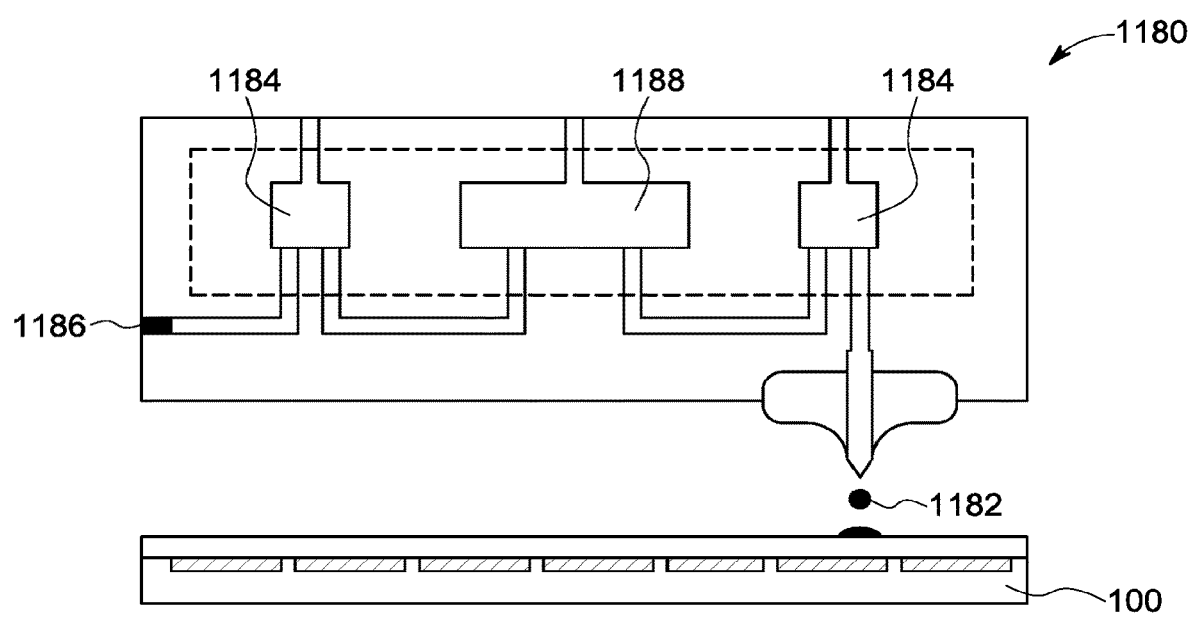

Referring to FIG. 11(j), an electrowetting device may include one or more stations 1180 designed to load biological samples, chemical reagents and liquids 1182 through a microdiaphragm pump 1184 based dispenser onto an electrowetting chip.

Either the acoustic droplet ejection technique of FIG. 11(i) or a microdiaphragm pump 1184 may be used to dispense fluid droplets of picoliter, nanoliter, or microliter volumes. An electrowetting device 100 placed above (FIG. 11(i)) the source plate captures the droplets 1168 ejected from the well plate and holds the droplets through electrowetting force. In this manner, samples containing nucleic acids, proteins, cells, salts, buffers, enzymes and any other biological and chemical reagent may be dispensed onto an electrowetting chip. In an alternative version (FIG. 11(j)), the electrowetting plate 100 is on the bottom and the acoustic droplet ejection transducer (1162 of FIG. 11(i)) or microdiaphragm pump 1184 is on the top. An input valve 1186 and larger microdiaphragm pump 1188 may be used to meter fluid flow into microdiaphragm pumps 1184. In this method the dispenser may be used to put samples on to an electrowetting chip on any arbitrary location.

In some cases, the electrowetting chip may be in an open plate configuration (no second plate) and droplets may be loaded directly onto the chip. In some cases, the electrowetting chip may have a second plate that sandwiches the droplet between an electrode array and a ground electrode. In some cases, the second plate (cover plate with or without ground) may have holes to allow the droplets in transit. In some cases, the droplets may be first loaded on an open plate and then a second plate may be added. In some cases the liquids loaded onto the electrowetting chip is in preparation to execute a workflow when the chip is located inside of an acoustic liquid handler. In some cases, the liquids loaded onto the electrowetting chip is in preparation to execute a workflow when the chip is located external to the acoustic liquid handler or microdiaphragm pump. In some cases, the liquids are loaded onto the electrowetting chip when a workflow is being executed. In some cases, the acoustic droplet injector or microdiaphragm pump may be mounted on a locatable carriage (somewhat like a 3D printer nozzle) capable of motion over the electrowetting device, so that droplets may be injected at a specific point over the electrowetting device.

Other alternatives for introducing or injecting liquid droplets may include inkjet printer inkjet nozzles, syringe pumps, capillary tubes, or pipettes.

In some cases, both the source and destination may be electrowetting chips. In this scenario, the chips may be organized with their electrode arrays facing each other. In some cases, droplets may be transferred between the top and bottom electrowetting chips, back and forth between top using acoustic fields or electric fields and differential wetting affinities. Here, there are acoustic transducers and coupling fluids on both sides of the chips. In some cases, samples on an electrowetting chip may be a source and the destination maybe a well plate. Here samples are transferred from the electrowetting chip on to a well plate using acoustic droplet ejection.

The spacing between the wells in a well plate and hence the format in which the liquids are loaded on to (and transferred away from) the electrowetting chip may be in standard well plate form or any other SDS well plate format or any arbitrary formats. The number of wells in the plate may be any arbitrary number in the range of one to a million.

The electrowetting chips loaded with samples from an acoustic droplet ejection device or microdiaphragm pump device may be combined with one or more of the functionalities of mixing station, incubation station, magnetic bead station, nucleic acid delivery station, optical inspection station, and/or other functionalities.

V. Alternative Implementations

V.A. Droplet on Open Surface (Single Plate Configuration) or Sandwiched Between Two Plates (Two Plate Configuration)

Figure 12A:
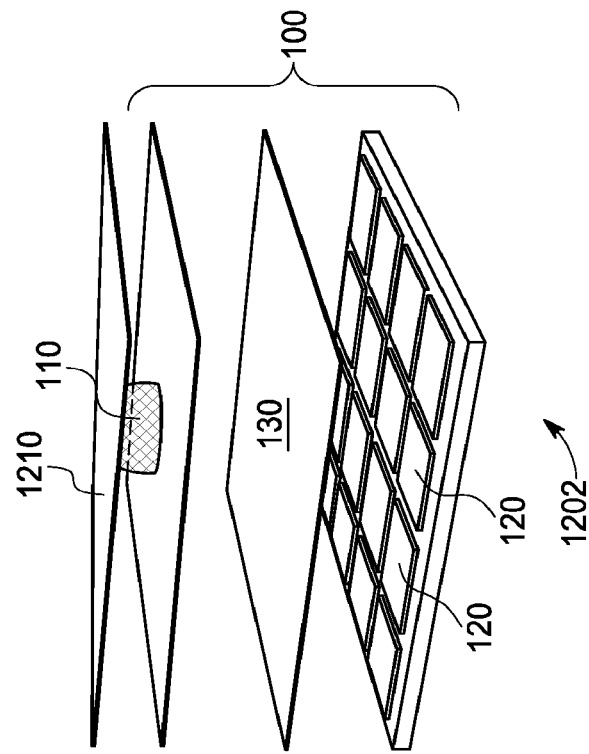
FIG. 12(*a*) is an exploded view of two configurations of an electrowetting device.
Figure 12A:
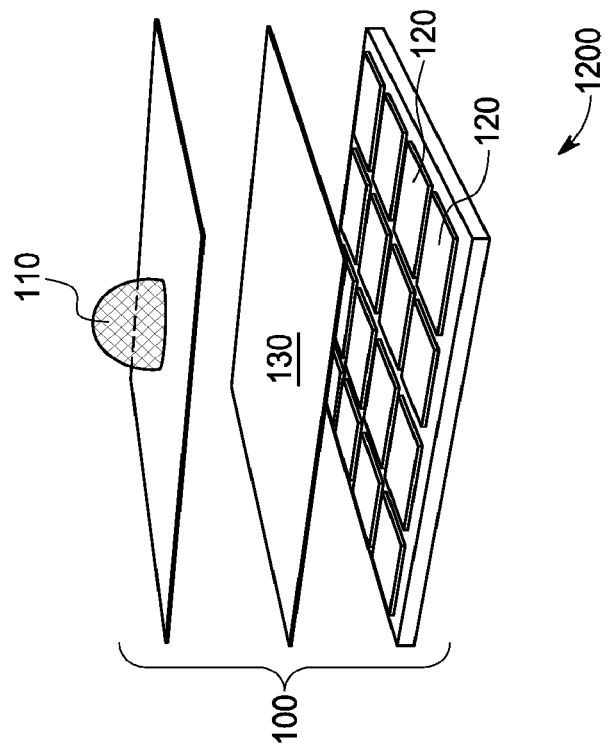

Referring to FIG. 12(a), for electrowetting droplet manipulation, a droplet may either be placed on an open surface (single plate) 1200, 100 or sandwiched between two plates (double plate) 100, 1202, 1210. In the double plate configuration 1202, a droplet may be sandwiched between two plates 100, 1210, typically separated by 100 p.m-500 p.m. The two plate configuration has electrodes 120 for providing actuation voltages on one side while the other side 1210 provides a reference electrode (typically a common ground signal). A droplet's constant contact to the reference electrode in a two plate configuration provides stronger force from the electric field on the droplet and hence robust control over droplets. The two plate configuration 1210 droplets may be split at a lower actuation voltage. In the single plate configuration 1200 the actuation electrodes and the reference electrode are on the same side.

Two-plate electrowetting systems may be improved by the surface treatments described above. In two-plate systems, a droplet is sandwiched between plates separated by a small distance. The space between the plates may be filled with another fluid or just air. Smoothing the liquid-facing surfaces of the two plates to 2 µm, or 500 nm, using the techniques described above, may allow two-plate systems to operate at lower voltages, with reduced droplet pinning, reduced leave-behind tracks, reduced cross-contamination, and reduced sample loss.

V.B. Optoelectrowetting and Photoelectrowetting

Figure 12B:
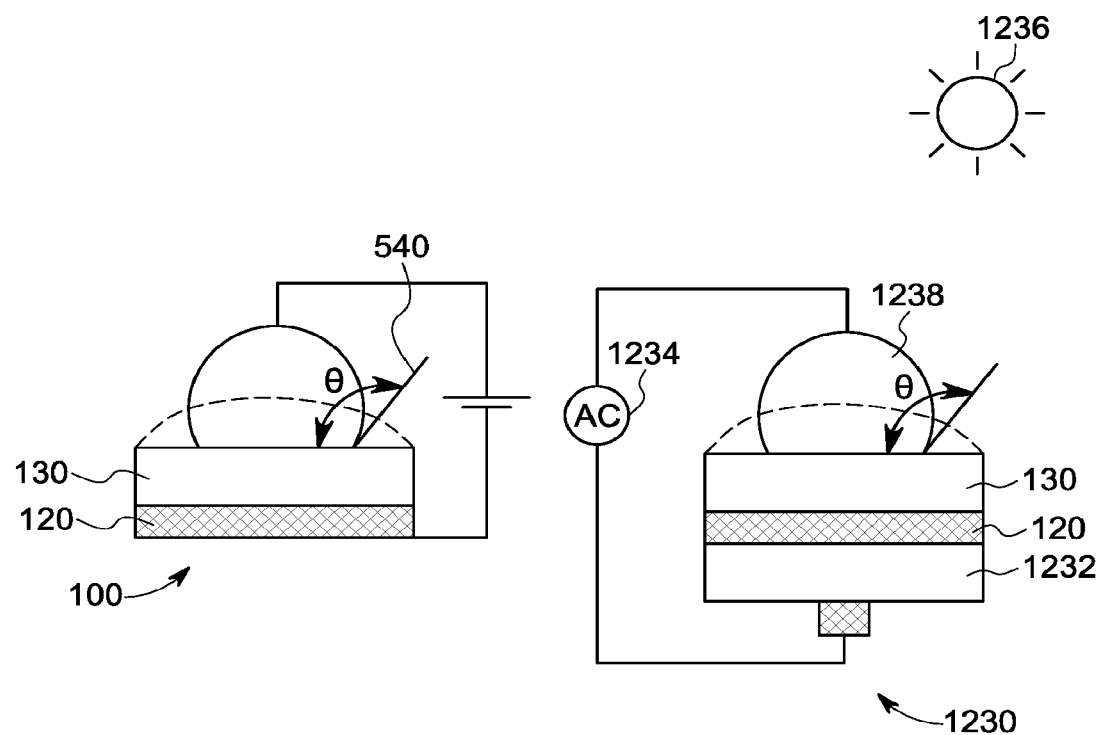
Figure 12C:
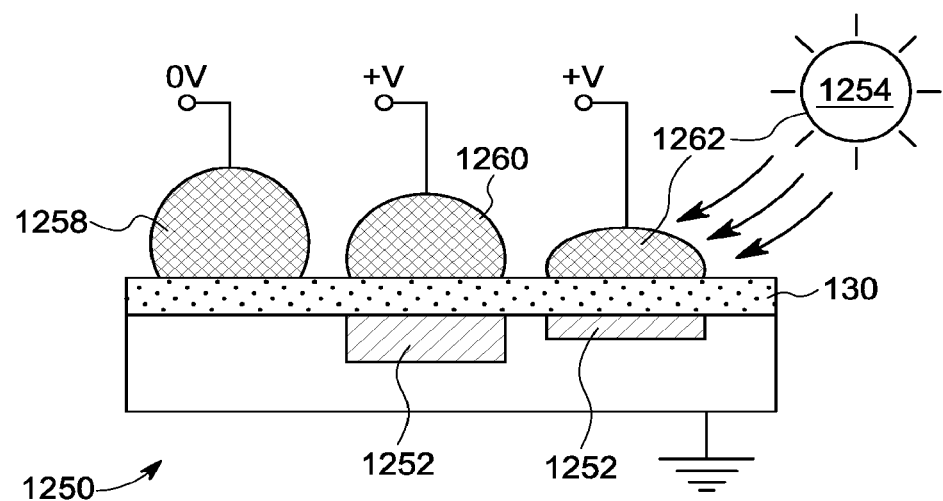

Referring to FIGS. 12(b) and 12(c), applying electric potential directly to an array of electrodes is one way of actuating droplets using electrowetting; however, there are alternate electrowetting mechanisms that differ from this conventional electrowetting mechanism. Two notable mechanisms, both of which use light for actuating the droplets, are described below—optoelectrowetting and photoelectrowetting. The general principles for manufacturing the electrowetting arrays, creating a smooth surface and slippery surface described above are applicable not only to conventional electrowetting described earlier, but is also applicable to optoelectrowetting, photoelectrowetting and other forms of electrowetting.

A liquid film may be laid on a grid of photoconductors, to yield "liquid on liquid optoelectrowetting." Instead of having a grid of electrodes under the lubricating liquid layer, the grid may be formed of light active photoconductor, either in a grid of pads, or as a single photoconductive circuit. Light shone on the photoconductor may form patterns and provide electrowetting effect. The textured solid and oil may be chosen to be sufficiently transparent to light so that the underlying surface is exposed to light to create differential wetting.

V.C. Optoelectrowetting

Referring to FIG. 12(b), the optoelectrowetting mechanism 1230 may use a photoconductor 1232 underneath the conventional electrowetting circuit (100, left side), with an AC power source 1234 attached. Under normal (dark) conditions, the majority of the system's impedance lies in the photoconducting region 1232 (since it is non-conductive), and therefore the majority of the voltage drop occurs here. However, when light 1236 is shone on the system, carrier generation and recombination causes the conductivity of the photoconductor 1232 to spike and the voltage drop across the photoconductor 1232 reduces. As a result a voltage drop occurs across the insulating layer 130, changing the contact angle, 540 vs. 1238, as a function of the voltage.

V.D. Photoelectrowetting

Referring to FIG. 12(c), photoelectrowetting is a modification of the wetting properties of a surface (typically a hydrophobic surface) using incident light. Whereas ordinary electrowetting is observed in a droplet sitting on a dielectric coated conductor (liquid/insulator/conductor stack 110/130/120), photoelectrowetting may be observed by replacing the conductor 120 with a semiconductor 1252 (liquid/insulator/semiconductor stack).

Incident light 1254 above the band gap of semiconductor 1252 creates photo-induced carriers via electron-hole pair generation in the depletion region of the underlying semiconductor 1252. This leads to a modification of the capacitance of the insulator/semiconductor stack 130/1252, resulting in a modification of the contact angle of a liquid droplet resting on the surface of the stack. The figure illustrates the principle of the photoelectrowetting effect. At zero bias (OV) the conducting droplet 1258 has a large contact angle (left image) if the insulator is hydrophobic. As the bias is increased (positive for a p-type semiconductor, negative for an n-type semiconductor) the droplet 1260 spreads out—i.e. the contact angle decreases (middle image). In the presence of light 1254 (having an energy superior to the band gap of the semiconductor 1252) the droplet 1262 spreads out more due to the reduction of the thickness of the space charge region at the insulator/semiconductor interface 130/1252 (right image).

V.E. Software and Hardware

Various processes described herein may be implemented by appropriately programmed general purpose computers, special purpose computers, and computing devices. Typically a processor (e.g., one or more microprocessors, one or more microcontrollers, one or more digital signal processors) will receive instructions (e.g., from a memory or like device), and execute those instructions, thereby performing one or more processes defined by those instructions. Instructions may be embodied in one or more computer programs, one or more scripts, or in other forms. The processing may be performed on one or more microprocessors, central processing units (CPUs), computing devices, microcontrollers, digital signal processors, or like devices or any combination thereof. Programs that implement the processing, and the data operated on, may be stored and transmitted using a variety of media. In some cases, hardwired circuitry or custom hardware may be used in place of, or in combination with, some or all of the software instructions that can implement the processes. Algorithms other than those described may be used.

Programs and data may be stored in various media appropriate to the purpose, or a combination of heterogenous media that may be read and/or written by a computer, a processor or a like device. The media may include non-volatile media, volatile media, optical or magnetic media, dynamic random access memory (DRAM), static ram, a floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH-EEPROM, any other memory chip or cartridge or other memory technologies.

Transmission media include coaxial cables, copper wire and fiber optics, including the wires that comprise a system bus coupled to the processor. Databases may be implemented using database management systems or ad hoc memory organization schemes. Alternative database structures to those described may be readily employed. Databases may be stored locally or remotely from a device which accesses data in such a database.

In some cases, the processing may be performed in a network environment including a computer that is in communication (e.g., via a communications network) with one or more devices. The computer may communicate with the devices directly or indirectly, via any wired or wireless medium (e.g. the Internet, LAN, WAN or Ethernet, Token Ring, a telephone line, a cable line, a radio channel, an optical communications line, commercial on-line service providers, bulletin board systems, a satellite communications link, a combination of any of the above). Each of the devices may themselves comprise computers or other computing devices, such as those based on the Intel® Pentium® or Centrino™ processor, that are adapted to communicate with the computer. Any number and type of devices may be in communication with the computer.

A server computer or centralized authority may or may not be necessary or desirable. In various cases, the network may or may not include a central authority device. Various processing functions may be performed on a central authority server, one of several distributed servers, or other distributed devices V.F. Other Alternatives For the convenience of the reader, the above description has focused on a representative sample of all possible embodiments, a sample that teaches the principles of the invention and conveys the best mode contemplated for carrying it out. Throughout this application and its associated file history, when the term "invention" is used, it refers to the entire collection of ideas and principles described; in contrast, the formal definition of the exclusive protected property right is set forth in the claims, which exclusively control. The description has not attempted to exhaustively enumerate all possible variations. Other undescribed variations or modifications may be possible. Where multiple alternative embodiments are described, in many cases it will be possible to combine elements of different embodiments, or to combine elements of the embodiments described here with other modifications or variations that are not expressly described. A list of items does not imply that any or all of the items are mutually exclusive, nor that any or all of the items are comprehensive of any category, unless expressly specified otherwise. In many cases, one feature or group of features may be used separately from the entire apparatus or methods described. Many of those undescribed variations, modifications and variations are within the literal scope of the following claims, and others are equivalent.

What is claimed is:

1. A system for processing a sample, comprising:
an array comprising (i) a first plurality of electrodes, (ii) a second plurality of electrodes, (iii) a liquid coating filling in gaps between adjacent electrodes of said first plurality of electrodes and said second plurality of electrodes, (iv) a dielectric disposed over said first plurality of electrodes, said second plurality of electrodes, and said liquid coating filling in gaps between said adjacent electrodes, and (v) a liquid layer disposed over said dielectric, wherein said liquid layer is configured to support a droplet on a surface of said liquid layer, wherein said droplet comprises said sample, wherein said liquid layer comprises a liquid that has a wetting affinity characteristic for said dielectric, wherein said liquid is immiscible with said droplet, and wherein said first plurality of electrodes and said second plurality of electrodes are configured to supply an electric field to induce said droplet to motion along a surface of said liquid layer; and
a controller operatively coupled to said first plurality of electrodes and said second plurality of electrodes, wherein said controller is configured to direct at least a subset of said first plurality of electrodes and said second plurality of electrodes to supply said electric field to alter a wetting characteristic of said surface of said liquid layer, to thereby induce said droplet to motion along said surface of said liquid layer.

2. The system of claim 1, wherein said electric field is between a subset of electrodes of said first plurality of electrodes, a subset of electrodes of said second plurality of electrodes, or between said first plurality of electrodes and said second plurality of electrodes.

3. The system of claim 1, wherein said second plurality of electrodes has a thickness of less than 10 μm.

4. The system of claim 1, wherein said surface of said liquid layer comprises one or more paths, wherein a path of said one or more paths comprises one or more tracks for motion of said droplet.

5. The system of claim 1, wherein said surface of said liquid layer is configured to support an additional droplet comprising an additional sample or a chemical sample.

6. The system of claim 1, further comprising a light source operatively coupled to said controller, wherein said controller is configured to alter said wetting characteristic of said surface of said liquid layer by directing said light source to apply light to said array.

7. The system of claim 1, further comprising one or more dispensers configured to dispense or remove said droplet to or from said surface.

8. The system of claim 1, wherein said dielectric comprises a polymeric material.

9. The system of claim 8, wherein said polymeric material is removable.

10. The system of claim 1, wherein said first plurality of electrodes and said second plurality of electrodes are coplanar.

11. The system of claim 1, wherein said first plurality of electrodes and said second plurality of electrodes are non-coplanar.

12. The system of claim 1, wherein said array further comprises one or more stations, wherein said one or more stations are selected from the group consisting of a mixing station, a temperature control station, a magnetic field station, an acoustic field station, a nucleic acid delivery station, an optical inspection station, an optical manipulation station, a droplet input station and a droplet output station.

13. The system of claim 1, wherein said dielectric has a thickness of at least 25 nanometers or at most 100 μm.

14. The system of claim 1, wherein said liquid layer comprises an upper surface, and wherein said upper surface of said liquid layer, said droplet, and a gas form a liquid-liquid-gas interface.

15. The system of claim 1, wherein said liquid layer and said dielectric form an electrical barrier between (1) said first plurality of electrodes and said second plurality of electrodes, and (2) said droplet.

16. The system of claim 1, wherein said liquid coating comprises a photoresist, epoxy, potting compound, liquid polymer, or other dielectric.

17. The system of claim 1, wherein said droplet comprises a biological sample.

18. The system of claim 1, wherein said electric field induces said droplet to motion in at least two directions along said surface of said liquid layer.

19. A method for processing a sample, comprising:
(a) providing an array comprising: (i) a first plurality of electrodes, (ii) a second plurality of electrodes, (iii) a liquid coating filling in gaps between adjacent electrodes of said first plurality of electrodes and said second plurality of electrodes, (iv) a dielectric disposed over said first plurality of electrodes, said second plurality of electrodes, and said liquid coating filling in gaps between said adjacent electrodes, and (v) a liquid layer disposed over said dielectric, wherein said liquid layer is configured to support a droplet on a surface of said liquid layer, wherein said droplet comprises said sample, wherein said liquid layer comprises a liquid that has a wetting affinity characteristic for said dielectric, and wherein said liquid is immiscible with said droplet;
(b) introducing said droplet comprising said sample on said surface of said liquid layer disposed over said dielectric; and
(c) directing at least a subset of said first plurality of electrodes and said second plurality of electrodes to supply an electric field to alter a wetting characteristic of said surface of said liquid layer, to thereby induce said droplet to motion along said surface of said liquid layer.

20. The method of claim 19, wherein altering said wetting characteristic comprises controlling charging and discharging of one or more electrodes of said first plurality of electrodes and said second plurality of electrodes in sequence.

21. The method of claim 19, wherein altering said wetting characteristic comprises applying light to said array.

22. The method of claim 19, further comprising, during or subsequent to (b), subjecting said droplet to heating, cooling, a magnetic field, a light field, acoustic energy, or mixing to manipulate said sample.

23. The method of claim 19, wherein said sample comprises a nucleic acid or a protein, and wherein subsequent to (c), said nucleic acid or protein is processed within said droplet.

24. The method of claim 19, further comprising, during or subsequent to (b), introducing an additional droplet comprising one or more additional samples over said surface.

25. The method of claim 24, further comprising merging said droplet and said additional droplet.

26. The method of claim 19, further comprising splitting said droplet.

27. The method of claim 19, further comprising replenishing said liquid layer.

28. The method of claim 19, wherein said dielectric comprises a polymeric material.

29. The method of claim 19, wherein said liquid layer and said dielectric form an electrical barrier between (1) said first plurality of electrodes and said second plurality of electrodes, and (2) said droplet.

30. The method of claim 19, wherein said liquid coating comprises a photoresist, epoxy, potting compound, liquid polymer, or other dielectric.

* * * * *